US007816953B2

(12) United States Patent
Hosokawa et al.

(10) Patent No.: US 7,816,953 B2
(45) Date of Patent: Oct. 19, 2010

(54) FREQUENCY DIVIDING CIRCUIT AND MULTIMODE RADIO DEVICE USING THE SAME

(75) Inventors: Yoshifumi Hosokawa, Oota-ku (JP); Noriaki Saito, Machida (JP); Michiaki Matsuo, Machida (JP); Yoshito Shimizu, Yokohama (JP)

(73) Assignee: Panasonic Corporation, Osaka (JP)

( * ) Notice: Subject to any disclaimer, the term of this patent is extended or adjusted under 35 U.S.C. 154(b) by 1076 days.

(21) Appl. No.: 10/596,820

(22) PCT Filed: Mar. 2, 2005

(86) PCT No.: PCT/JP2005/003527
§ 371 (c)(1),
(2), (4) Date: Jun. 26, 2006

(87) PCT Pub. No.: WO2005/086366
PCT Pub. Date: Sep. 15, 2005

(65) Prior Publication Data
US 2007/0099580 A1    May 3, 2007

(30) Foreign Application Priority Data
Mar. 4, 2004 (JP) ............................. 2004-060388
Feb. 23, 2005 (JP) ............................. 2005-047649

(51) Int. Cl.
*H03B 19/00* (2006.01)
(52) U.S. Cl. ..................... 327/117; 327/115; 327/238
(58) Field of Classification Search ................. 327/115, 327/117, 118, 120, 122, 254–258
See application file for complete search history.

(56) References Cited

U.S. PATENT DOCUMENTS 6,545,517 B2 *   4/2003   Asam ......................... 327/115

(Continued)

FOREIGN PATENT DOCUMENTS

CN        1379928 A      11/2002

(Continued)

OTHER PUBLICATIONS

Chinese Office Action, Aug. 28, 2008.

(Continued)

*Primary Examiner*—Hai L Nguyen
(74) *Attorney, Agent, or Firm*—Pearne & Gordon LLP

(57) ABSTRACT

A frequency dividing section is made up of a frequency divider for dividing output of a local oscillator, a frequency divider for dividing output of an in-phase local oscillation signal of the frequency divider, and a dummy circuit connected to the output terminal of a quadrature local oscillation signal of the frequency divider. At the first frequency band operation time, output of the frequency divider is used for modulation and demodulation and at the second frequency band operation time, output of the frequency divider is used for modulation and demodulation. Although the frequency divider is shared between the first and second frequency bands, the dummy circuit is made the same circuit as an input amplifier of the frequency divider at the first frequency band operation time, so that the phase difference between the in-phase local oscillation signal and the quadrature local oscillation signal output by the frequency divider can be kept. Accordingly, the frequency dividers are shared and combined for lessening the circuit scale.

15 Claims, 14 Drawing Sheets

U.S. PATENT DOCUMENTS

| | | |
|---|---|---|
| 6,714,765 B1 | 3/2004 | Kimppa |
| 6,815,993 B1 | 11/2004 | Ishimoto et al. |
| 6,917,232 B2 * | 7/2005 | Wyatt et al. .................. 327/238 |
| 6,963,236 B2 * | 11/2005 | Berkram et al. ............. 327/238 |
| 7,403,048 B2 * | 7/2008 | Heidari et al. ............... 327/117 |
| 7,508,273 B2 * | 3/2009 | Redman-White ............ 331/16 |

FOREIGN PATENT DOCUMENTS

| | | |
|---|---|---|
| CN | 1156988 C | 7/2004 |
| JP | 9-261106 | 10/1997 |
| JP | 2000-124829 | 4/2000 |
| JP | 2002-64397 | 2/2002 |
| JP | 2002-280924 | 9/2002 |

OTHER PUBLICATIONS

Hongming Li: Lectures on Digital Integrated Circuit (5), Electronic World, vol. 8, 1998, pp. 40-41, Aug. 1, 1998.

Aoki, "Analog IC no Kinou Kairo Sekkei Nyuumon", CQ Shuppansha, p. 169 (English Translation).

International Search Report of International Publication No. WO 2005-086366.

* cited by examiner

FREQUENCY DIVIDING CIRCUIT AND MULTIMODE RADIO DEVICE USING THE SAME

TECHNICAL FIELD

This invention relates to a frequency dividing circuit made up of frequency dividers and a multimode radio that can use a plurality of radio systems by using the frequency dividing circuit to switch frequencies.

BACKGROUND ART

A multimode radio in a related art is described in patent document 1. FIG. 14 shows a configuration example of the multimode radio in the related art compatible with radio system A and radio system B described in patent document 1.

In FIG. 14, an antenna 901 is shared between the radio system A and the radio system B. The antenna 901 is connected to a duplexer 902 of the radio system A and a duplexer 903 of the radio system B. In a transmission system, an in-phase baseband transmission signal is input from an in-phase baseband input terminal 916 to a low-pass filter 914. The in-phase baseband transmission signal is modulated by a quadrature modulator 913 and becomes an in-phase intermediate frequency transmission signal. A quadrature baseband transmission signal is input from a quadrature baseband input terminal 917 to a low-pass filter 915. The quadrature baseband transmission signal is modulated by the quadrature modulator 913 and becomes a quadrature intermediate frequency transmission signal. The in-phase intermediate frequency transmission signal and the quadrature intermediate frequency transmission signal are amplified by a variable gain amplifier 912 and unnecessary frequency components are removed through a low-pass filter 911. The in-phase intermediate frequency transmission signal and the quadrature intermediate frequency transmission signal are up converted by a transmission mixer 910 and are subjected to gain control by a variable gain amplifier 909 and becomes a transmission signal of the radio system A or the radio system B. When the multimode radio operates with the radio system A, a high frequency switch 908 connects to a power amplifier 906. When the multimode radio operates with the radio system B, the high frequency switch 908 connects to a power amplifier 907. The transmission signal of the radio system A is transmitted from the antenna 901 through an isolator 904 and the duplexer 902, and the transmission signal of the radio system B is transmitted from the antenna 901 through an isolator 905 and the duplexer 903.

In a reception system, when the multimode radio operates with the radio system A, a reception signal of the radio system A received at the antenna 901 is amplified by a low noise amplifier 919 through the duplexer 902. The amplified reception signal is subjected to frequency conversion by a reception mixer 921 and then passes through an intermediate frequency filter 923 corresponding to the reception frequency and becomes an intermediate frequency reception signal. The intermediate frequency reception signal is input to a variable gain amplifier 926 through an intermediate frequency switch 925. When the multimode radio operates with the radio system B, a reception signal of the radio system B received at the antenna 901 is amplified by a low noise amplifier 920 through the duplexer 903. The amplified reception signal is subjected to frequency conversion by a reception mixer 922 and then passes through an intermediate frequency filter 924 corresponding to the reception frequency and becomes an intermediate frequency reception signal. The intermediate frequency reception signal is input to the variable gain amplifier 926 through the intermediate frequency switch 925. The amplified intermediate frequency reception signal is demodulated by a quadrature demodulator 927 and becomes an in-phase baseband reception signal and a quadrature baseband reception signal. The in-phase baseband reception signal passes through a low-pass filter 928 and is output from an in-phase baseband output terminal 930. The quadrature baseband reception signal passes through a low-pass filter 929 and is output from a quadrature baseband output terminal 931.

A first local oscillator 918 outputs a transmission local oscillation signal corresponding to the radio system A and the radio system B to a transmission mixer 910. The first local oscillator 918 outputs a reception local oscillation signal corresponding to the radio system A and the radio system B to reception mixers 921 and 922. A second local oscillator 933 outputs a modulation local oscillation signal to the quadrature modulator 913 through a frequency dividing section 936. The second local oscillator 933 outputs a demodulation local oscillation signal to the quadrature demodulator 927.

The frequency dividing section 936 is made up of frequency dividers and switches setting the frequency dividing counts corresponding to the modulation local oscillation signal and the demodulation local oscillation signal of the radio system A and the modulation local oscillation signal and the demodulation local oscillation signal of the radio system B. A frequency divider 951 corresponds to the modulation local oscillation signal of the radio system A. A frequency divider 952 corresponds to the modulation local oscillation signal of the radio system B. The frequency divider 951 and the frequency divider 952 are switched by a switch 955. A frequency divider 953 corresponds to the demodulation local oscillation signal of the radio system A. A frequency divider 954 corresponds to the demodulation local oscillation signal of the radio system B. The frequency divider 953 and the frequency divider 954 are switched by a switch 956. At the radio system A operation time, the switch 955 connects to the frequency divider 951 and the switch 956 connects to the frequency divider 953. At the radio system B operation time, the switch 955 connects to the frequency divider 952 and the switch 956 connects to the frequency divider 954. The multimode radio includes as many frequency dividers as the number of covered radio systems and the number of modulation and demodulation combinations. As the frequency dividers are switched by the switch, the multimode radio in the related art can switch among radio systems using different frequency bands without increasing the number of local oscillators.

As an example of sharing and combining frequency dividers, a first frequency divider for dividing output of a local oscillator and a second frequency divider for dividing output of the first frequency divider are included. It is assumed that the output of the first frequency divider corresponds to a first radio system and the output of the second frequency divider corresponds to a second radio system. The frequency divider inputs an in-phase local oscillation signal and a quadrature local oscillation signal having a 90° phase difference to a quadrature modulator and a quadrature demodulator. To obtain output of the first frequency divider, the second frequency divider is connected to either of in-phase local oscillation signal output and quadrature local oscillation signal output of the first frequency divider. Here, it is assumed that the in-phase local oscillation signal output of the first frequency divider connects to the second frequency divider. When the multimode radio operates with the first radio system, the second frequency divider need not be operated and may be turned off by a switch. However, it is difficult to implement an open/short switch in IC in an actual circuit and the circuit operation is turned on/off by current control (non-patent document 1).

Patent document 1: JP-A-9-261106 (p. 4-p. 5, FIG. 2)

Non-patent document 1: "Analog IC no kinou kairo sekkei nyuumon" written by AOKI Hidehiko, CQ Shuppansha, p. 168

DISCLOSURE OF THE INVENTION

Problems that the Invention is to Solve

However, in the configuration in the related art shown above in (patent document 1), as many frequency dividers as the number of radio systems covered by the multimode radio are required. Further, the frequency divider having a positive frequency dividing count is provided by using 2-frequency-dividing circuits and 3-frequency-dividing circuits in combination and therefore has a problem of increasing the circuit scale. It is an object of the invention to lessen the circuit scale by sharing and combining frequency dividers in setting the frequency dividing count about frequency dividers of the configuration in the related art.

Incidentally, in the configuration in the related art shown above in (patent document 1), the first frequency divider for dividing output of the local oscillator and the second frequency divider for dividing output of the first frequency divider are included and the circuit operation is turned on/off by current control as shown in (non-patent document 1). The off circuit is connected to the path which is on as a load and affects the path which is on. When the output of the first frequency divider is input to the quadrature modulator or the quadrature demodulator, the second frequency divider which is off is affected. Therefore, an error occurs in the 90° phase difference between the in-phase local oscillation signal and the quadrature local oscillation signal of the first frequency divider. The in-phase local oscillation signal and the quadrature local oscillation signal input to the quadrature modulator and the quadrature demodulator need keep the 90° phase difference therebetween with high accuracy. However, if the frequency dividers are shared and combined, the impedance symmetry of the first frequency divider output terminal worsens because of the circuit which is off, and a phases error occurs; this is a problem. The invention is intended for solving the above-described problems in the related arts and it is an object of the invention to provide a multimode radio whose circuit scale is lessened and simplified by sharing frequency dividers and eliminating the output phase error.

Means for Solving the Problems

To solve the problems in the related arts, the first frequency dividing circuit of the invention is a frequency dividing circuit including a first frequency divider for dividing output of a local oscillator and outputting a first in-phase local oscillation signal and a first quadrature local oscillation signal, a second frequency divider being connected to the first in-phase local oscillation signal output for dividing the first in-phase local oscillation signal and outputting a second in-phase local oscillation signal and a second quadrature local oscillation signal, and phase correction means for keeping the phase difference between the first in-phase local oscillation signal and the first quadrature local oscillation signal at 90 degrees. It is made possible to share and combine the frequency dividers and the circuit scale can be kept small and be simplified.

The second frequency dividing circuit of the invention is a frequency dividing circuit including a first frequency divider for dividing output of a local oscillator and outputting a first in-phase local oscillation signal and a first quadrature local oscillation signal, a second frequency divider being connected to the first quadrature local oscillation signal output for dividing the first quadrature local oscillation signal and outputting a second in-phase local oscillation signal and a second quadrature local oscillation signal, and phase correction means for keeping the phase difference between the first in-phase local oscillation signal and the first quadrature local oscillation signal at 90 degrees. It is made possible to share and combine the frequency dividers and the circuit scale can be kept small and be simplified.

The third frequency dividing circuit of the invention is a frequency dividing circuit wherein in the first frequency dividing circuit of the invention, the phase correction means includes a dummy circuit being connected to the first quadrature local oscillation signal output and having input impedance equal to that of the second frequency divider. It is made possible to share and combine the frequency dividers, the circuit scale can be lessened and simplified, and the dummy circuit having the input impedance equal to that of the second frequency divider is included, whereby the phase difference between the first in-phase local oscillation signal and the first quadrature local oscillation signal can be kept at high accuracy.

The fourth frequency dividing circuit of the invention is a frequency dividing circuit wherein in the second frequency dividing circuit of the invention, the phase correction means includes a dummy circuit being connected to the first in-phase local oscillation signal output and having input impedance equal to that of the second frequency divider. It is made possible to share and combine the frequency dividers, the circuit scale can be lessened and simplified, and the dummy circuit having the input impedance equal to that of the second frequency divider is included, whereby the phase difference between the first in-phase local oscillation signal and the first quadrature local oscillation signal can be kept at high accuracy.

The fifth frequency dividing circuit of the invention is a frequency dividing circuit wherein in the first or second frequency dividing circuit of the invention, the phase correction means includes a control section for controlling the current of an in-phase output amplifier of the first frequency divider and a quadrature output amplifier of the first frequency divider. It is made possible to share and combine the frequency dividers, the circuit scale can be lessened and simplified, and the current of the in-phase output amplifier and the quadrature output amplifier is controlled, so that the phase difference between the first in-phase local oscillation signal and the first quadrature local oscillation signal can be kept at high accuracy.

The sixth frequency dividing circuit of the invention is a frequency divider circuit wherein in the first frequency dividing circuit of the invention, the phase correction means includes a control section for controlling the current of a dummy circuit connected to the first quadrature local oscillation signal output, an in-phase output amplifier of the first frequency divider, and a quadrature output amplifier of the first frequency divider. It is made possible to share and combine the frequency dividers, the circuit scale can be lessened and simplified, the dummy circuit having the input impedance equal to that of the second frequency divider is included, and the current of the in-phase output amplifier and the quadrature output amplifier is controlled, so that the phase difference between the first in-phase local oscillation signal and the first quadrature local oscillation signal can be kept at high accuracy.

The seventh frequency dividing circuit of the invention is a frequency divider circuit wherein in the second frequency dividing circuit of the invention, the phase correction means includes a control section for controlling the current of a dummy circuit connected to the first in-phase local oscillation signal output, an in-phase output amplifier of the first frequency divider, and a quadrature output amplifier of the first frequency divider. It is made possible to share and combine the frequency dividers, the circuit scale can be lessened and simplified, the dummy circuit having the input impedance equal to that of the second frequency divider is included, and the current of the in-phase output amplifier and the quadrature output amplifier is controlled, so that the phase difference between the first in-phase local oscillation signal and the first quadrature local oscillation signal can be kept at high accuracy.

The dummy circuit may be a circuit including a resistor and a capacitor, may be an amplifier having the same circuit configuration as an input amplifier of the second frequency divider, or may have the same circuit configuration as a part of an input amplifier of the second frequency divider.

When the dummy circuit has the same circuit configuration as the input amplifier of the second frequency divider, the control section may control the current of the dummy circuit and the input amplifier.

The first multimode radio of the invention is a multimode radio including any of the frequency dividing circuits described above, and includes a local oscillator for outputting a local oscillation signal to the first frequency divider, a first quadrature modulator to which the first in-phase local oscillation signal and the first quadrature local oscillation signal are input, the first quadrature modulator for performing quadrature modulation of an in-phase baseband transmission signal and a quadrature baseband transmission signal and outputting a first transmission signal having a first frequency, and a second quadrature modulator to which the second in-phase local oscillation signal and the second quadrature local oscillation signal are input, the second quadrature modulator for performing quadrature modulation of the in-phase baseband transmission signal and the quadrature baseband transmission signal and outputting a second transmission signal having a second frequency. It is made possible to share and combine the frequency dividers in the transmission system, and the circuit scale can be lessened and simplified.

The multimode radio may further include a control section being connected to the second frequency divider, the first quadrature modulator, and the second quadrature modulator for switching a mode between a mode of transmitting the first transmission signal and a mode of transmitting the second transmission signal.

The second multimode radio of the invention is a multimode radio including any of the frequency dividing circuits described above, and includes a local oscillator for outputting a local oscillation signal to the first frequency divider, a first quadrature demodulator to which the first in-phase local oscillation signal and the first quadrature local oscillation signal are input, the first quadrature demodulator for performing quadrature demodulation of a first reception signal having a first frequency and outputting an in-phase baseband reception signal and a quadrature baseband reception signal, and a second quadrature demodulator to which the second in-phase local oscillation signal and the second quadrature local oscillation signal are input, the second quadrature demodulator for performing quadrature demodulation of a second reception signal having a second frequency and outputting the in-phase baseband reception signal and the quadrature baseband reception signal. It is made possible to share and combine the frequency dividers in the reception system, and the circuit scale can be lessened and simplified.

The multimode radio may further include a control section being connected to the second frequency divider, the first quadrature demodulator, and the second quadrature demodulator for switching a mode between a mode of receiving the first reception signal and a mode of receiving the second reception signal.

The third multimode radio of the invention is a multimode radio including any of the frequency dividing circuits described above, and includes a local oscillator for outputting a local oscillation signal to the first frequency divider, a first quadrature modulator to which the first in-phase local oscillation signal and the first quadrature local oscillation signal are input, the first quadrature modulator for performing quadrature modulation of an in-phase baseband transmission signal and a quadrature baseband transmission signal and outputting a first transmission signal having a first frequency, a second quadrature modulator to which the second in-phase local oscillation signal and the second quadrature local oscillation signal are input, the second quadrature modulator for performing quadrature modulation of the in-phase baseband transmission signal and the quadrature baseband transmission signal and outputting a second transmission signal having a second frequency, a first quadrature demodulator to which the first in-phase local oscillation signal and the first quadrature local oscillation signal are input, the first quadrature demodulator for performing quadrature demodulation of a first reception signal having the first frequency and outputting an in-phase baseband reception signal and a quadrature baseband reception signal, and a second quadrature demodulator to which the second in-phase local oscillation signal and the second quadrature local oscillation signal are input, the second quadrature demodulator for performing quadrature demodulation of a second reception signal having the second frequency and outputting the in-phase baseband reception signal and the quadrature baseband reception signal. It is made possible to share and combine the frequency dividers in the transmission-reception system, and the circuit scale can be lessened and simplified.

The multimode radio may further include a control section being connected to the second frequency divider, the including a control section being connected to the second frequency divider, the first quadrature modulator, the second quadrature modulator, the first quadrature demodulator, and the second quadrature demodulator for switching a mode between a mode of transmitting the first transmission signal and receiving the first reception signal and a mode of transmitting the second transmission signal and receiving the second reception signal.

ADVANTAGES OF THE INVENTION

A multimode radio whose circuit scale is lessened and simplified can be provided according to the multimode radio of the invention.

DESCRIPTION OF REFERENCE NUMERALS

Figure 1:
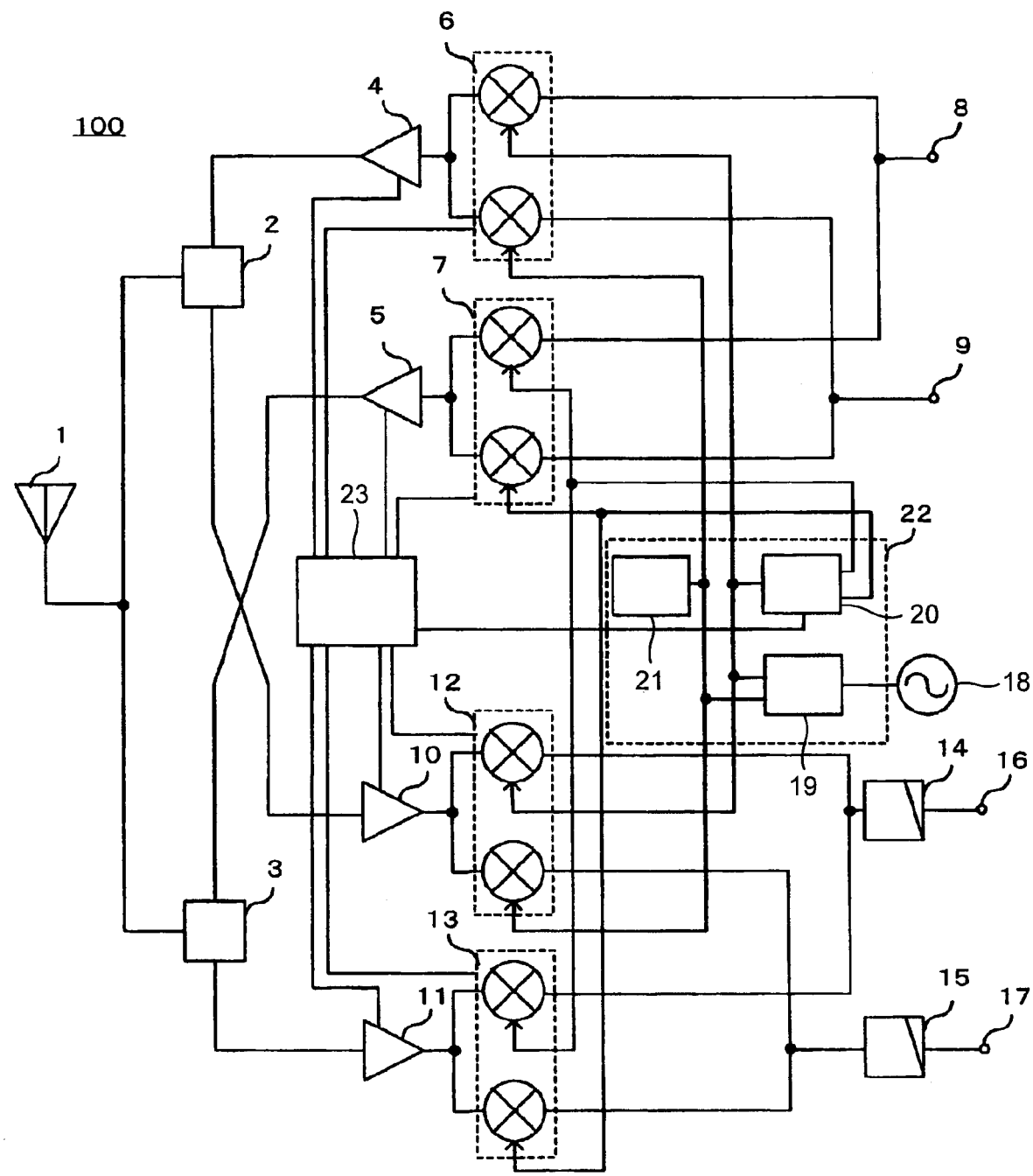
FIG. 1 A diagram to show the configuration of a multimode radio in a first embodiment of the invention.

1 Antenna
2 Duplexer
3 Duplexer
4 Power amplifier
5 Power amplifier
6 Quadrature modulator
7 Quadrature modulator
8 In-phase baseband input terminal
9 Quadrature baseband input terminal
10 Low noise amplifier
11 Low noise amplifier
12 Quadrature demodulator
13 Quadrature demodulator
14 Low-pass filter
15 Low-pass filter
16 In-phase baseband output terminal
17 Quadrature baseband output terminal
18 Local oscillator
19 Frequency divider
20 Frequency divider
21 Dummy circuit
22 Frequency dividing section
23 Control section
31 Low noise amplifier
32 Low noise amplifier
33 Reception mixer
34 Reception mixer
35 Quadrature demodulator
36 Quadrature demodulator
37 Dummy circuit
38 Frequency divider
39 Dummy circuit
40 Frequency divider
100 Multimode radio
201 Transistor
202 Transistor
203 Resistor
204 Resistor
205 Transistor
206 Current control terminal
301 Input amplifier
302 Flip-flop circuit
303 Flip-flop circuit
304 In-phase output amplifier
305 Quadrature output amplifier
306 Input amplifier
307 Flip-flop circuit
308 Flip-flop circuit
309 In-phase output amplifier
310 Quadrature output amplifier
400 Multimode radio
501 Input amplifier
502 Flip-flop circuit
503 Flip-flop circuit
504 In-phase output amplifier
505 Quadrature output amplifier
506 Amplifier
600 Multimode radio
601 Frequency divider
602 Dummy circuit
603 Frequency divider
604 Input amplification circuit
605 Transistor
606 Transistor
607 Load resistor
608 Load resistor
609 Transistor
610 Resistor
700 Multimode radio
701 Frequency divider
702 Frequency dividing section
703 In-phase output amplifier
704 Quadrature output amplifier
705 Transistor
706 Transistor
707 Load resistor
708 Load resistor
709 Transistor
710 Resistor
800 Multimode radio
801 Frequency dividing section
901 Antenna
902 Duplexer
903 Duplexer
904 Isolator
905 Isolator
906 Power amplifier
907 Power amplifier
908 High frequency switch
909 Variable gain amplifier
910 Transmission mixer
911 Low-pass filter
912 Variable gain amplifier
913 Quadrature modulator
914 Low-pass filter
915 Low-pass filter
916 In-phase baseband input terminal
917 Quadrature baseband input terminal
918 First local oscillator
919 Low noise amplifier 920 Low noise amplifier
921 Reception mixer
922 Reception mixer
923 Intermediate frequency filter
924 Intermediate frequency filter
925 Intermediate frequency filter
926 Variable gain amplifier
927 Quadrature demodulator
928 Low-pass filter
929 Low-pass filter
930 In-phase baseband output terminal
931 Quadrature baseband output terminal
933 Second local oscillator
934 Frequency dividing section
936 Frequency divider
951 Frequency divider
952 Frequency divider
953 Frequency divider
954 Frequency divider
955 Switch
956 Switch

BEST MODE FOR CARRYING OUT THE INVENTION

Embodiments of the invention will be discussed with the accompanying drawings.

First Embodiment

In a first embodiment, the operation of a multimode radio for covering two frequency bands will be discussed.

FIG. 1 shows a configuration example of a multimode radio in the first embodiment. A multimode radio 100 in the first embodiment uses a first frequency band and a second frequency band. In the description to follow, as a specific example, a radio system is GSM, the first frequency band is 1800-MHz band, and the second frequency band is 900-MHz band, but any other radio system and frequency band may be adopted. The operation modes are 1800-MHz mode and 900-MHz mode.

In FIG. 1, an antenna 1 is shared between the 1800-MHz band and the 900-MHz band. The antenna 1 is connected to a duplexer 2 corresponding to the 1800-MHz band and a duplexer 3 corresponding to the 900-MHz band. First, a transmission system will be discussed. An in-phase baseband input terminal 8 and a quadrature baseband input terminal 9 are connected to a quadrature modulator 6 corresponding to the 1800-MHz band and a quadrature modulator 7 corresponding to the 900-MHz band. When the multimode radio 100 operates in the 1800-MHz mode, a baseband transmission signal is input from the in-phase baseband input terminal 8 and the quadrature baseband input terminal 9. The baseband transmission signal is quadrature-modulated by the quadrature modulator 6 and becomes a 1800-MHz band transmission signal. The transmission signal is amplified by a power amplifier 4 corresponding to the 1800-MHz band. The amplified transmission signal is transmitted from the antenna 1 through the duplexer 2.

When the multimode radio 100 operates in the 900-MHz mode, likewise a baseband transmission signal is input from the in-phase baseband input terminal 8 and the quadrature baseband input terminal 9. The baseband transmission signal is quadrature-modulated by the quadrature modulator 7 and becomes a 900-MHz band transmission signal. The transmission signal is amplified by a power amplifier 5 corresponding to the 900-MHz band. The amplified transmission signal is transmitted from the antenna 1 through the duplexer 3.

Next, a reception system will be discussed. When the multimode radio 100 operates in the 1800-MHz mode, a reception signal received at the antenna 1 is input to a low noise amplifier 10 corresponding to the 1800-MHz band through the duplexer 2. The reception signal is amplified by the low noise amplifier 10. The amplified reception signal is quadrature-demodulated by a quadrature demodulator 12 corresponding to the 1800-MHz band and becomes an in-phase baseband reception signal and a quadrature baseband reception signal. The in-phase baseband reception signal passes through a low-pass filter 14 and is output to an in-phase baseband output terminal 16. The quadrature baseband reception signal passes through a low-pass filter 15 and is output to a quadrature baseband output terminal 17.

When the multimode radio 100 operates in the 900-MHz mode, likewise a reception signal received at the antenna 1 is input to a low noise amplifier 11 corresponding to the 900-MHz band through the duplexer 3. The reception signal is amplified by the low noise amplifier 11. The amplified reception signal is quadrature-demodulated by a quadrature demodulator 13 corresponding to the 900-MHz band and becomes an in-phase baseband reception signal and a quadrature baseband reception signal. The in-phase baseband reception signal passes through the low-pass filter 14 and is output to the in-phase baseband output terminal 16. The quadrature baseband reception signal passes through the low-pass filter 15 and is output to the quadrature baseband output terminal 17. A frequency synthesizer has a local oscillator 18 for outputting a 3.6-GHz band signal and a frequency dividing section 22. The frequency synthesizer outputs an in-phase local oscillation signal and a quadrature local oscillation signal having a 90° phase difference to the quadrature modulators 6 and 7 and the quadrature demodulators 12 and 13.

A frequency divider 19 divides output of the local oscillator 18 (3.6-GHz band) into two parts. A frequency divider 20 divides an in-phase local oscillation signal of the frequency divider 19 into two parts. A dummy circuit 21 is connected to the quadrature local oscillation signal side of the frequency divider 19. The frequency dividing section 22 is made up of the frequency divider 19, the frequency divider 20, and the dummy circuit 21. The frequency divider 19 outputs a 1800-MHz in-phase local oscillation signal and a 1800-MHz quadrature local oscillation signal to the quadrature modulator 6 or the quadrature demodulator 12. The frequency divider 20 outputs a 900-MHz in-phase local oscillation signal and a 900-MHz quadrature local oscillation signal to the quadrature modulator 7 or the quadrature demodulator 13. A control section 23 performs current control in accordance with the operation mode of the multimode radio 100. The control section 23 outputs a signal so as to turn off the current of circuits not in the operation mode and controls the circuit operation.

Figure 2:
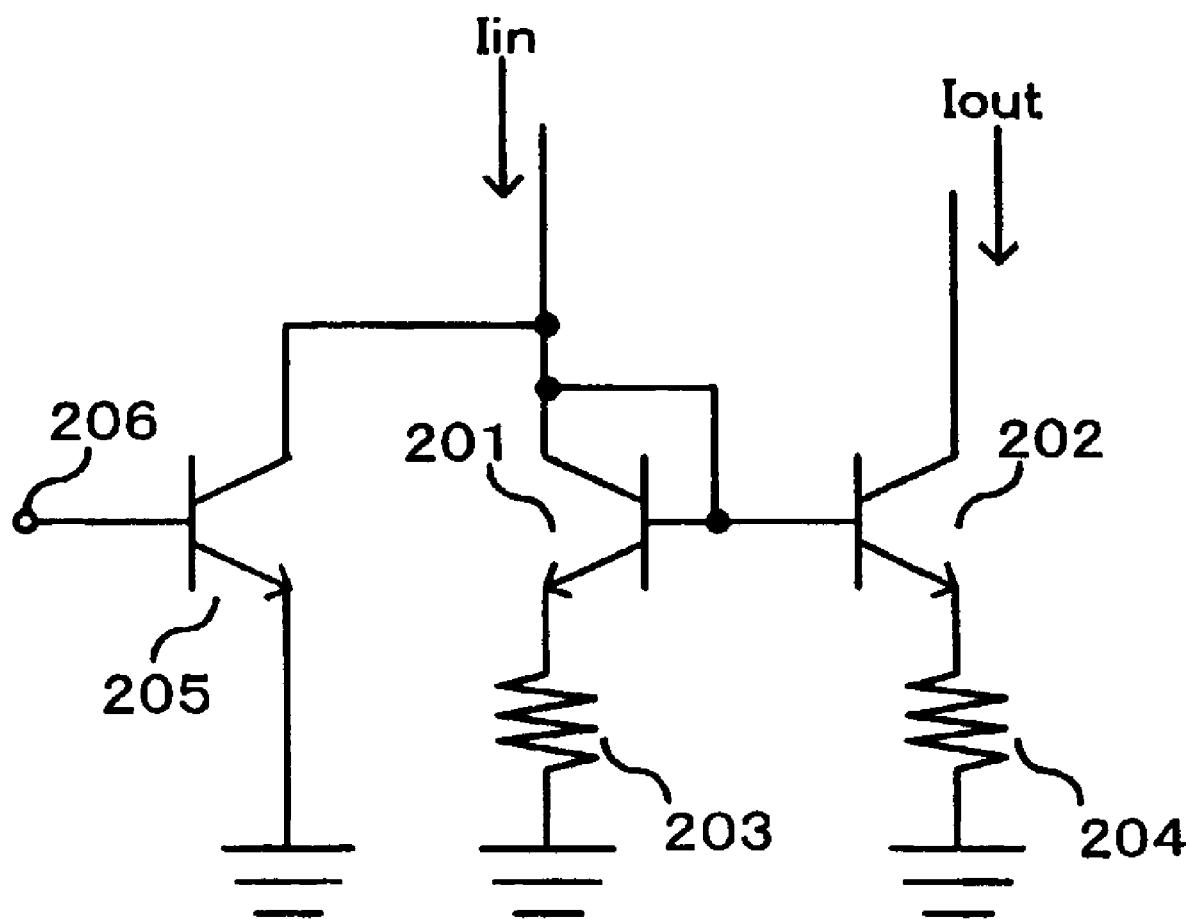
FIG. 2 A circuit diagram to show a current control method in the first embodiment of the invention.
Figure 3:
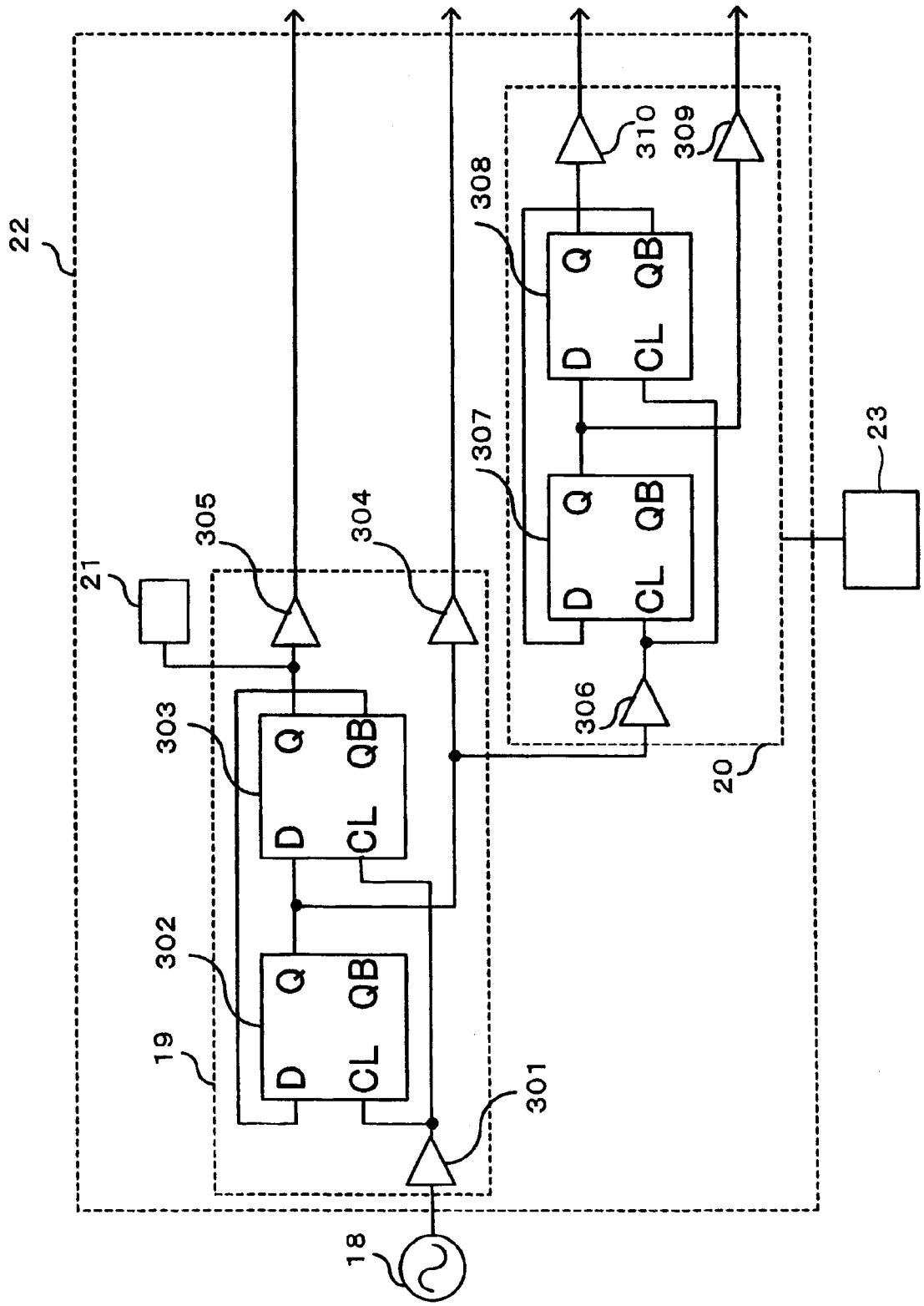
FIG. 3 A diagram to show the configuration of a frequency dividing section of the multimode radio in the first embodiment of the invention.

FIG. 2 is a diagram to show an example of a current control method in the control section 23. FIG. 3 is a diagram to show the configuration of the frequency dividing section 22. The current control method will be discussed with FIG. 2 and then the operation of the frequency dividing section 22 will be discussed with FIG. 3.

In FIG. 2, a transistor 201, a transistor 202, a resistor 203, and a resistor 204 make up a current mirror circuit. At the current mirror circuit operation time, input current Iin flowing into the transistor 201 and the resistor 203 and output current Iout flowing into the transistor 202 and the resistor 204 have the following relationship: Letting the emitter area of the transistor 201 be N1, the emitter area of the transistor 202 be N2, the resistance value of the resistor 203 be R3, the resistance value of the resistor 204 be R4, and N1R3=N2R4, the output current Iout becomes Iout=(N2/N1) Iin. Therefore, the amplifier, the quadrature modulator, the quadrature demodulator, and the frequency divider are connected to a collector of the transistor 202.

A transistor 205 and a current control terminal 206 make up a switch. When the current control terminal 206 is low, the transistor 205 is off. When the current control terminal 206 is high, the transistor 205 is on. Therefore, when the current control terminal 206 is low, the current Iin does not flow into the transistor 205 and flows into the transistor 201 and the current mirror circuit operates. When the current control 206 is high, the input current Iin does not flow into the transistor 201 and flows through the transistor 205 and the current mirror circuit does not operate. Accordingly, the operation of the amplifier, the quadrature modulator, the quadrature demodulator, and the frequency divider of the multimode radio can be switched on/off. If the current control method is used, the control section 23 outputs a low signal to the circuit in the operation mode and a high signal to the circuit not in the operation mode for switching the circuit.

Parts identical with those shown in FIG. 1 are denoted by the same reference numerals in FIG. 3. The frequency divider 19 has an input amplifier 301, a flip-flop circuit 302 at a master stage, a flip-flop circuit 303 at a slave stage, an in-phase output amplifier 304, and a quadrature output amplifier 305. Output of the local oscillator 18 is amplified by the input amplifier 301. The amplified output of the local oscillator 18 is input to clock inputs of the flip-flop circuit 302 and the flip-flop circuit 303. Q output of the flip-flop circuit 302 and D input of the flip-flop circuit 303 are connected. QB output of the flip-flop circuit 303 and D input of the flip-flop circuit 302 are connected.

A 1800-MHz in-phase local oscillation signal provided by dividing an input signal of the local oscillator 18 into two parts is output from the Q output of the flip-flop circuit 302. The 1800-MHz in-phase local oscillation signal is amplified by the in-phase output amplifier 304. A 1800-MHz quadrature local oscillation signal provided by dividing the input signal of the local oscillator 18 into two parts and having the phase leading that of the 1800-MHz in-phase local oscillation signal by 90° is output from Q output of the flip-flop circuit 303. The 1800-MHz quadrature local oscillation signal is amplified by the quadrature output amplifier 305.

The frequency divider 20 has an input amplifier 306 connected to the Q output of the flip-flop circuit 302, a flip-flop circuit 307 at a master stage, a flip-flop circuit 308 at a slave stage, an in-phase output amplifier 309, and a quadrature output amplifier 310. The 1800-MHz in-phase local oscillation signal of the flip-flop circuit 302 is amplified by the input amplifier 306. The amplified 1800-MHz in-phase local oscillation signal is input to clock inputs of the flip-flop circuit 307 and the flip-flop circuit 308. Q output of the flip-flop circuit 307 and D input of the flip-flop circuit 308 are connected. QB output of the flip-flop circuit 308 and D input of the flip-flop circuit 307 are connected. A 900-MHz in-phase local oscillation signal provided by dividing the 1800-MHz in-phase local oscillation signal of the frequency divider 19 into two parts is output from the Q output of the flip-flop circuit 307. The 900-MHz in-phase local oscillation signal is amplified by the in-phase output amplifier 309. A 900-MHz quadrature local oscillation signal provided by dividing the 1800-MHz in-phase local oscillation signal of the frequency divider 19 into two parts and having the phase leading that of the 900-MHz in-phase local oscillation signal by 90° is output from Q output of the flip-flop circuit 308. The 900-MHz quadrature local oscillation signal is amplified by the quadrature output amplifier 310.

This means that the 900-MHz in-phase local oscillation signal and the 900-MHz quadrature local oscillation signal output by the frequency divider 20 are provided by dividing the signal of the local oscillator 18 into four parts. A dummy circuit 21 is connected to the Q output of the flip-flop circuit 303. The frequency divider 20 and the control section 23 are connected. When the multimode radio 100 operates in the 1800-MHz mode, the frequency divider 20 is turned off.

At the 1800-MHz mode operation time, the 1800-MHz in-phase local oscillation signal and the 1800-MHz quadrature local oscillation signal are output from the frequency divider 19. The turned-off frequency divider 20 is connected to the Q output of the flip-flop circuit 302 for outputting the 1800-MHz in-phase local oscillation signal. The dummy circuit 21 is connected to the Q output of the flip-flop circuit 303 for outputting the 1800-MHz quadrature local oscillation signal. Here, the dummy circuit 21 is made the same circuit as the input amplifier 306 of the turned-off frequency divider 20, whereby the turned-off frequency divider 20 and the dummy circuit 21 keep impedance symmetry. Thus, the highly accurate 90° phase difference between the 1800-MHz in-phase local oscillation signal and the 1800-MHz quadrature local oscillation signal can be provided. The dummy circuit 21 may have the circuit configuration of a part of the input amplifier 306. For example, if the input amplifier 306 has a transistor to which a signal is input, a load element, a current source circuit, a bias circuit, etc., a transistor having the same configuration as the transistor may be used as the dummy circuit 21. As the dummy circuit 21 is made closer to the same circuit configuration as the input amplifier 306, the phase difference with higher accuracy can be provided.

At the transmission time, the control section 23 performs current control so that the power amplifier 4 and the quadrature modulator 6 are turned on and the low noise amplifier 10 and the quadrature demodulator 12 are turned off. At the reception time, the control section 23 performs current control so that the power amplifier 4 and the quadrature modulator 6 are turned off and the low noise amplifier 10 and the quadrature demodulator 12 are turned on. At the transmission time, the turned-off quadrature demodulator 12 is connected to the frequency divider 19. However, the same circuit is connected to the 1800-MHz in-phase local oscillation signal and the 1800-MHz quadrature local oscillation signal and thus the input impedance symmetry is not affected. Likewise, at the reception time, the turned-off quadrature modulator 6 is connected to the frequency divider 19, but the same circuit is connected to the 1800-MHz in-phase local oscillation signal and the 1800-MHz quadrature local oscillation signal and thus the impedance symmetry is not affected.

At this time, the use bands of the 1800-MHz band and the 900-MHz band and the frequency bands of the local oscillator 18 are as listed in (Table 1). In (Table 1), Tx denotes the transmission time and Rx denotes the reception time. As seen from (Table 1), in the 1800-MHz band, the use band is a half the frequency band of the local oscillator 18; in the 900-MHz band, the use band becomes a quarter of the frequency band of the local oscillator 18.

TABLE 1

| | 1800-MHz band | | 900-MHz band | |
| --- | --- | --- | --- | --- |
| | Tx | Rx | Tx | Rx |
| Use band [MHz] | 1710-1785 | 1805-1880 | 880-915 | 925-960 |
| Frequency band of local oscillator 18 [MHz] | 3420-3570 | 3610-3760 | 3520-3660 | 3700-3840 |

Thus, the frequency dividers are shared among radio systems and are combined, so that a multimode radio whose circuit scale is lessened and simplified can be provided.

In the description of the first embodiment, the circuit is assumed to be an unbalanced circuit, but may be a balanced circuit.

The dummy circuit 21 may be made up of a resistor and a capacitor if the dummy circuit 21 has the same impedance as the input amplifier 306 of the turned-off frequency divider 20.

In the first embodiment, the dummy circuit 21 is connected to the quadrature local oscillation signal side of the frequency divider 19 and the frequency divider 20 is connected to the in-phase local oscillation signal, but the connection may be opposite.

The dummy circuit 21 may be used not only to keep the 90° phase difference, but also to keep the 180° phase difference.

Second Embodiment

In a second embodiment of the invention, the operation of a multimode radio for covering four frequency bands will be discussed.

Figure 4:
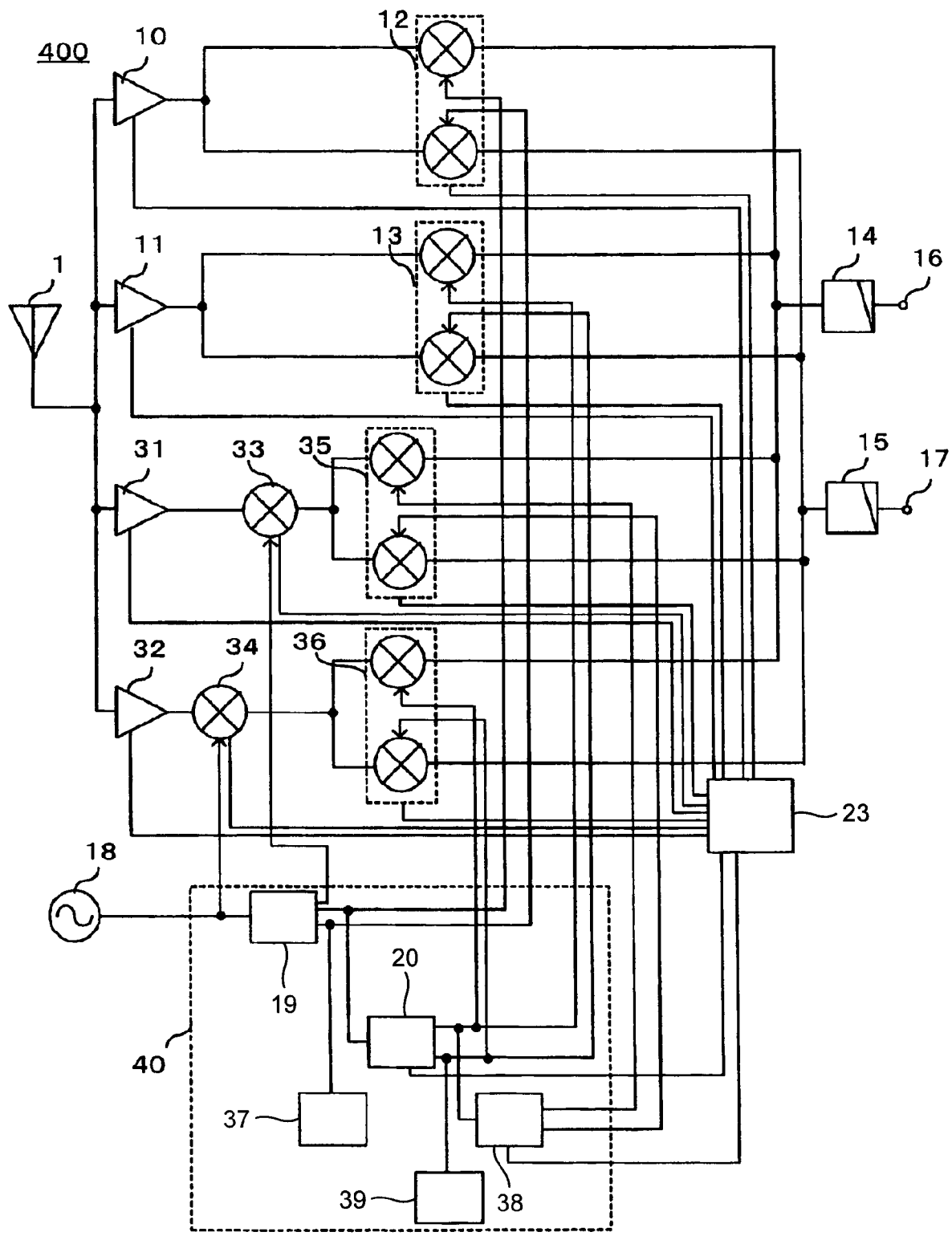
FIG. 4 A diagram to show the configuration of a multimode radio in a second embodiment of the invention.

FIG. 4 shows a configuration example of a reception system of a multimode radio in the second embodiment. The multimode radio in the second embodiment is a multimode radio using four frequency bands. As a specific example, in the description to follow, it is assumed that the four bands are 1800-MHz band and 900-MHz band of GSM, 5.2-GHz band of IEEE 802.11a, and 2.4-GHz band of IEEE 802.1b. The operation modes are 1800-MHz mode, 900-MHz mode, 5.2-GHz mode, and 2.4-GHz mode. Parts identical with those shown in FIG. 1 are denoted by the same reference numerals in FIG. 4. An antenna 1 is shared among the 900-MHz band, the 1800-MHz band, the 2.4-GHz band, and the 5.2-GHz band. The antenna 1 is connected to a low noise amplifier 10, a low noise amplifier 11, a low noise amplifier 31 corresponding to the 2.4-GHz band, and a low noise amplifier 32 corresponding to the 5.2-GHz band.

When multimode radio 400 operates in the 1800-MHz mode, a reception signal received at the antenna 1 is amplified by the low noise amplifier 10. The amplified reception signal is quadrature-demodulated by a quadrature demodulator 12 and becomes an in-phase baseband reception signal and a quadrature baseband reception signal. The in-phase baseband reception signal passes through a low-pass filter 14 and is output to an in-phase baseband output terminal 16. The quadrature baseband reception signal passes through a low-pass filter 15 and is output to a quadrature baseband output terminal 17.

When the multimode radio 400 operates in the 900-MHz mode, likewise a reception signal received at the antenna 1 is amplified by the low noise amplifier 11. The amplified reception signal is quadrature-demodulated by a quadrature demodulator 13 and becomes an in-phase baseband reception signal and a quadrature baseband reception signal. The in-phase baseband reception signal passes through the low-pass filter 14 and is output to the in-phase baseband output terminal 16. The quadrature baseband reception signal passes through the low-pass filter 15 and is output to the quadrature baseband output terminal 17.

When the multimode radio 400 operates in the 2.4-GHz mode, a reception signal received at the antenna 1 is amplified by the low noise amplifier 31. The amplified reception signal is subjected to frequency conversion to an intermediate frequency of a 500-MHz band by a reception mixer 33 corresponding to the 2.4-GHz band. The reception signal which becomes the intermediate frequency is quadrature-demodulated by a quadrature demodulator 35 corresponding to the 500-MHz band and becomes an in-phase baseband reception signal and a quadrature baseband reception signal. The in-phase baseband reception signal passes through the low-pass filter 14 and is output to the in-phase baseband output terminal 16. The quadrature baseband reception signal passes through the low-pass filter 15 and is output to the quadrature baseband output terminal 17.

When the multimode radio 400 operates in the 5.2-GHz mode, a reception signal received at the antenna 1 is amplified by the low noise amplifier 32. The amplified reception signal is subjected to frequency conversion to an intermediate frequency of a 1000-MHz band by a reception mixer 34 corresponding to the 5.2-GHz band. The reception signal which becomes the intermediate frequency is quadrature-demodulated by a quadrature demodulator 36 corresponding to the 1000-MHz band and becomes an in-phase baseband reception signal and a quadrature baseband reception signal. The in-phase baseband reception signal passes through the low-pass filter 14 and is output to the in-phase baseband output terminal 16. The quadrature baseband reception signal passes through the low-pass filter 15 and is output to the quadrature baseband output terminal 17. A frequency synthesizer has a local oscillator 18 for outputting a 4.0-GHz band from 3.6 GHz and a frequency dividing section 40. The frequency synthesizer outputs an in-phase local oscillation signal and a quadrature local oscillation signal having a 90° phase difference to the quadrature demodulators 12, 13, 35, and 36. The frequency synthesizer outputs a local oscillation signal to the reception mixers 33 and 34.

A frequency divider 19 divides output of the local oscillator 18 into two parts. A frequency divider 20 divides an in-phase local oscillation signal of the frequency divider 19 into two parts. A dummy circuit 37 is connected to the quadrature local oscillation signal side of the frequency divider 19. A frequency divider 38 divides an in-phase local oscillation signal of the frequency divider 20 into two parts. A dummy circuit 39 is connected to the quadrature local oscillation signal side of the frequency divider 20. The frequency dividing section 40 has the frequency divider 19, the frequency divider 20, the dummy circuit 37, the frequency divider 38, and the dummy circuit 39. A control section 23 outputs a signal so as to turn off the circuits not in the operation mode and controls the circuit operation.

Figure 5:
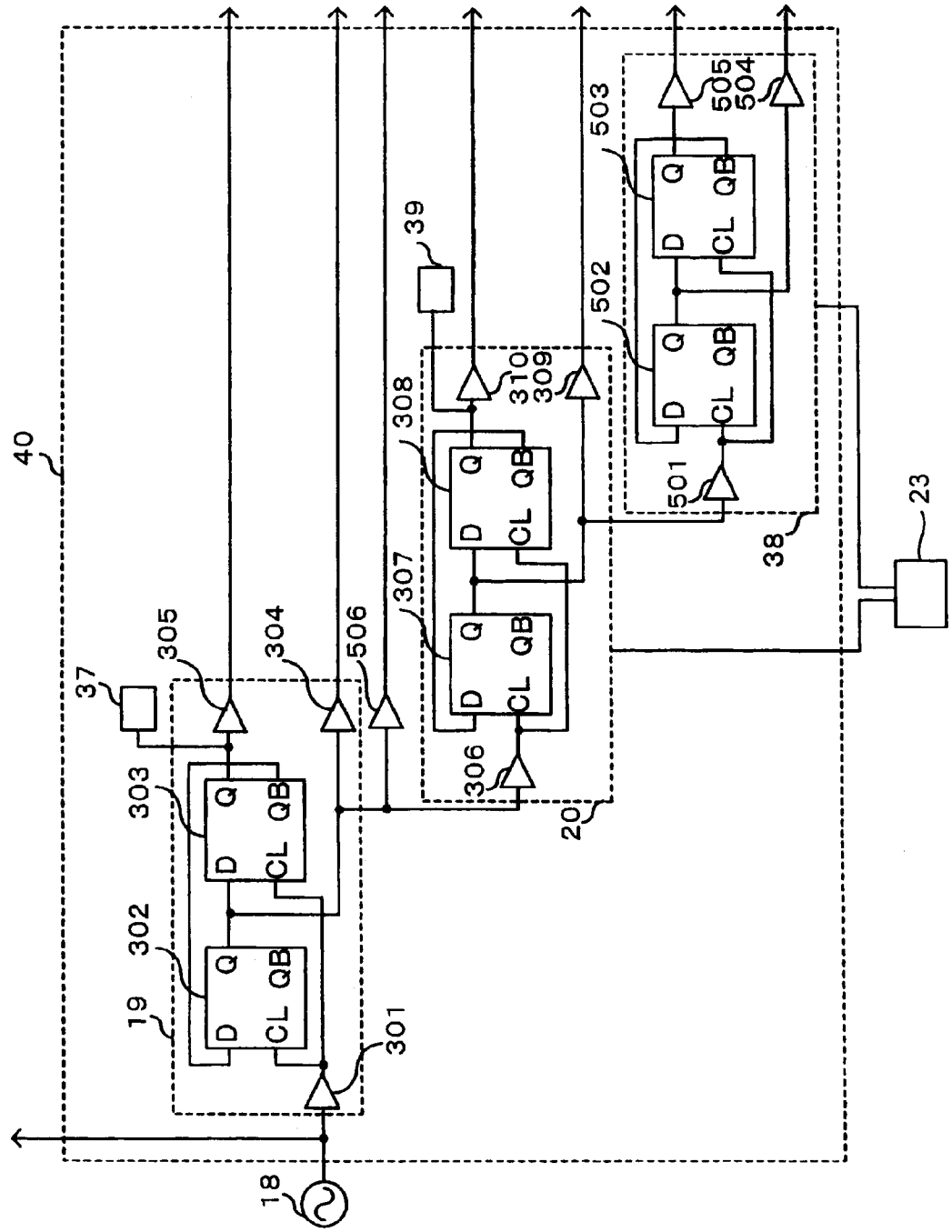
FIG. 5 A diagram to show the configuration of a frequency dividing section of the multimode radio in the second embodiment of the invention.

FIG. 5 is a diagram to show the configuration of the frequency dividing section 40. Parts identical with those shown in FIG. 4 are denoted by the same reference numerals in FIG. 5. The frequency divider 19 has an input amplifier 301, a flip-flop circuit 302 at a master stage, a flip-flop circuit 303 at a slave stage, an in-phase output amplifier 304, and a quadrature output amplifier 305. Output of the local oscillator 18 is amplified by the input amplifier 301. The amplified output of the local oscillator 18 is input to clock inputs of the flip-flop circuit 302 and the flip-flop circuit 303. Q output of the flip-flop circuit 302 and D input of the flip-flop circuit 303 are connected. QB output of the flip-flop circuit 303 and D input of the flip-flop circuit 302 are connected. A 1800-MHz in-phase local oscillation signal provided by dividing an input signal (3.6-GHz band) of the local oscillator 18 into two parts is output from the Q output of the flip-flop circuit 302. The 1800-MHz in-phase local oscillation signal is amplified by the in-phase output amplifier 304. A 1800-MHz quadrature local oscillation signal provided by dividing the input signal of the local oscillator 18 into two parts and having the phase leading that of the 1800-MHz in-phase local oscillation signal by 90° is output from Q output of the flip-flop circuit 303. The 1800-MHz quadrature local oscillation signal is amplified by the quadrature output amplifier 305. When the input signal of the local oscillator 18 is a 4.0-GHz band signal, a 2000-MHz in-phase local oscillation signal is output from the frequency divider 19 through an amplifier 506.

The frequency divider 20 has an input amplifier 306 connected to the Q output of the flip-flop circuit 302, a flip-flop circuit 307 at a master stage, a flip-flop circuit 308 at a slave stage, an in-phase output amplifier 309, and a quadrature output amplifier 310. The 1800-MHz in-phase local oscillation signal is amplified by the input amplifier 306. The amplified 1800-MHz in-phase local oscillation signal is input to clock inputs of the flip-flop circuit 307 and the flip-flop circuit 308. Q output of the flip-flop circuit 307 and D input of the flip-flop circuit 308 are connected. QB output of the flip-flop circuit 308 and D input of the flip-flop circuit 307 are connected.

A 900-MHz in-phase local oscillation signal provided by dividing the 1800-MHz in-phase local oscillation signal of the frequency divider 19 into two parts is output from the Q output of the flip-flop circuit 307. The 900-MHz in-phase local oscillation signal is amplified by the in-phase output amplifier 309. A 900-MHz quadrature local oscillation signal provided by dividing the 1800-MHz in-phase local oscillation signal of the frequency divider 19 into two parts and having the phase leading that of the 900-MHz in-phase local oscillation signal by 90° is output from Q output of the flip-flop circuit 308. The 900-MHz quadrature local oscillation signal is amplified by the quadrature output amplifier 310. This means that the output of the frequency divider 20 is provided by dividing the signal of the local oscillator 18 (3.6-GHz band) into four parts. When the input signal of the local oscillator 18 is a 4.0-GHz band signal, a 1000-MHz in-phase local oscillation signal and a 1000-MHz quadrature local oscillation signal are output from the frequency divider 20.

The frequency divider 38 has an input amplifier 501 connected to the Q output of the flip-flop circuit 307, a flip-flop circuit 502 at a master stage, a flip-flop circuit 503 at a slave stage, an in-phase output amplifier 504, and a quadrature output amplifier 505. The 1000-MHz in-phase local oscillation signal is amplified by the input amplifier 501. The amplified 1000-MHz in-phase local oscillation signal is input to clock inputs of the flip-flop circuit 502 and the flip-flop circuit 503. Q output of the flip-flop circuit 502 and D input of the flip-flop circuit 503 are connected. QB output of the flip-flop circuit 503 and D input of the flip-flop circuit 502 are connected. A 500-MHz in-phase local oscillation signal provided by dividing the 1000-MHz in-phase local oscillation signal of the frequency divider 20 into two parts is output from the Q output of the flip-flop circuit 502. The 500-MHz in-phase local oscillation signal is amplified by the in-phase output amplifier 504. A 500-MHz quadrature local oscillation signal provided by dividing the 1000-MHz in-phase local oscillation signal of the frequency divider 20 into two parts and having the phase leading that of the 500-MHz in-phase local oscillation signal by 90° is output from Q output of the flip-flop circuit 503. The 500-MHz quadrature local oscillation signal is amplified by the quadrature output amplifier 505. This means that the output of the frequency divider 38 is provided by dividing the input signal of the local oscillator 18 (4.0-GHz band) into eight parts.

A dummy circuit 37 is connected to the Q output of the flip-flop circuit 303. A dummy circuit 39 is connected to the Q output of the flip-flop circuit 308.

The control section 23 is connected to the frequency divider 20 and the frequency divider 38. The operation of the frequency divider 20, 38 is switched on/off in response to the operation mode of the multimode radio 400. When the multimode radio 400 operates in the 1800-MHz mode, only the frequency divider 19 operates and outputs the 1800-MHz in-phase local oscillation signal and the 1800-MHz quadrature local oscillation signal to the quadrature demodulator 12. At this time, the frequency divider 20 and the frequency divider 38 are turned off by the control section 23. When the multimode radio 400 operates in the 900-MHz mode, the frequency divider 19 and the frequency divider 20 operate and output the 900-MHz in-phase local oscillation signal and the 900-MHz quadrature local oscillation signal to the quadrature demodulator 13. At this time, the frequency divider 38 is turned off by the control section 23.

When the multimode radio 400 operates in the 2.4-GHz mode, the frequency divider 19, the frequency divider 20, and the frequency divider 38 operate. The frequency divider 19 outputs the 2000-MHz in-phase local oscillation signal to the reception mixer 33. The frequency divider 38 outputs the 500-MHz in-phase local oscillation signal and the 500-MHz quadrature local oscillation signal to the quadrature demodulator 35. When the multimode radio 400 operates in the 5.2-GHz mode, the frequency divider 19 and the frequency divider 20 operate. The local oscillator 18 outputs a 4000-MHz local oscillation signal to the reception mixer 34. The frequency divider 20 outputs the 1000-MHz in-phase local oscillation signal and the 1000-MHz quadrature local oscillation signal to the quadrature demodulator 36. At this time, the frequency divider 38 is turned off by the control section 23. The operation of the frequency dividing section 40 for each operation mode of the multimode radio 400 is listed in (Table 2):

TABLE 2

| | Frequency divider 19 | Frequency divider 20 | Frequency divider 38 |
|---|---|---|---|
| At 900-MHz operation time | ON | ON | OFF |
| At 1800-MHz operation time | ON | OFF | OFF |
| At 2.4-GHz operation time | ON | ON | ON |
| At 5.2-GHz operation time | ON | ON | OFF |

At the 1800-MHz mode operation time, the turned-off frequency divider 20 and the turned-off amplifier 506 are connected to the Q output of the flip-flop circuit 302. However, the dummy circuit 37 is made the same circuit as the input amplifier 306 of the turned-off frequency divider 20 and the turned-off amplifier 506, whereby the impedance symmetry is kept. Thus, the highly accurate 90° phase difference between the 1800-MHz in-phase local oscillation signal and the 1800-MHz quadrature local oscillation signal can be provided. At the 900-MHz mode operation time, the turned-off frequency divider 38 is connected to the Q output of the flip-flop circuit 307. However, the dummy circuit 39 is made the same circuit as the input amplifier 501 of the turned-off frequency divider 38, whereby the impedance symmetry is kept. Thus, the highly accurate 90° phase difference between the 900-MHz in-phase local oscillation signal and the 900-MHz quadrature local oscillation signal can be provided.

The dummy circuit 37 may have the circuit configuration of a part of the input amplifier 306 and the amplifier 506, and the dummy circuit 39 may have the circuit configuration of a part of the input amplifier 501.

Likewise, also at the 5.2-GHz operation time, the turned-off frequency divider 38 and the dummy circuit 39 keep the impedance balance. Thus, the 1000-MHz in-phase local oscillation signal and the 1000-MHz quadrature local oscillation signal can be provided. Output of the frequency divider 20 is connected to the quadrature demodulator 13 and the quadrature demodulator 36. At the 900-MHz operation time, the control section 23 performs current control so that the quadrature demodulator 13 is turned on and the quadrature demodulator 36 is turned off. At the 5.2-GHz operation time, the control section 23 performs current control so that the quadrature demodulator 13 is turned off and the quadrature demodulator 36 is turned on. At the 900-MHz operation time, the turned-off quadrature demodulator 36 is connected. However, the same circuit is connected to the 900-MHz in-phase local oscillation signal and the 900-MHz quadrature local oscillation signal and thus the input impedance symmetry is not affected. Likewise, at the 5.2-GHz operation time, the turned-off quadrature demodulator 13 is connected, but the impedance symmetry is not affected.

At this time, the use frequency bands of the local oscillator 18 for the use bands of the operation modes are as listed in (Table 3).

TABLE 3

|  | 900-MHz band | 1800-MHz band | 2.4-GHz band | 5.2-GHz band |
| --- | --- | --- | --- | --- |
| Use band [MHz] | 925-960 | 1805-1880 | 2400-2483.5 | 5150-5350 |
| Frequency band of local oscillator 18 [MHz] | 3700-3840 | 3610-3760 | 3840-3973.6 | 4120-4280 |

Thus, the frequency dividers are shared and are combined so as to cover a plurality of radio systems, so that a multimode radio whose circuit scale is lessened and simplified can be provided.

In the second embodiment, the reception system of the multimode radio has been described, but a transmission system can be realized in a similar manner, needless to say.

In the second embodiment, the quadrature demodulators are provided in a one-to-one correspondence with the radio systems. However, using one quadrature demodulator corresponding to a plurality of radio systems, the local oscillation signal input to the quadrature demodulator may be switched for each radio system.

In the second embodiment, GSM 1800-MHz band, GSM 900-MHz band, IEEE 802.11a, and IEEE 802.11b have been described as the radio systems. However, any other radio system may be adopted.

The dummy circuit 37 may be made up of a resistor and a capacitor if the dummy circuit 37 has the same impedance as the input amplifier 306 of the turned-off frequency divider 20 and the amplifier 506.

The dummy circuit 39 may be made up of a resistor and a capacitor if the dummy circuit 39 has the same impedance as the input amplifier 501 of the turned-off frequency divider 38.

In the second embodiment, the dummy circuit 37 is connected to the quadrature local oscillation signal side of the frequency divider 19 and the frequency divider 20 is connected to the in-phase local oscillation signal, but the connection may be opposite. The dummy circuit 39 is connected to the quadrature local oscillation signal side of the frequency divider 20 and the frequency divider 38 is connected to the in-phase local oscillation signal, but the connection may be opposite.

The dummy circuits 37 and 39 may be used not only to keep the 90° phase difference, but also to keep the 180° phase difference.

The number of the radio systems covered by the multimode radio is two in the first embodiment and four in the second embodiment. However, the number of the radio systems covered by the multimode radio is not limited to two or four and may be three or five or more.

Third Embodiment

Figure 6:
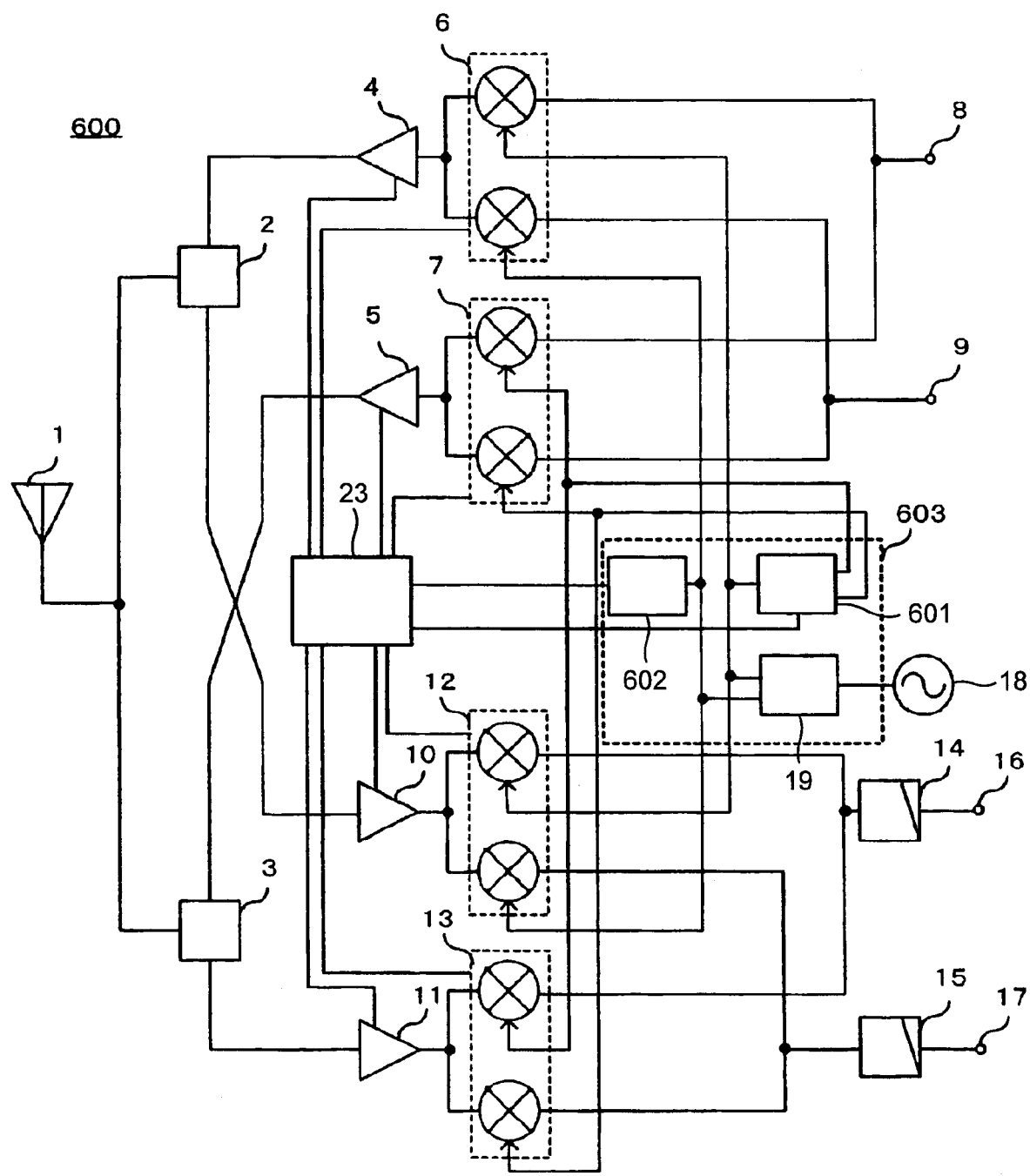
FIG. 6 diagram to show the configuration of a multimode radio in a third embodiment of the invention.

FIG. 6 shows a configuration example of a multimode radio in a third embodiment of the invention. A multimode radio 600 of the third embodiment uses a first frequency band and a second frequency band. As a specific example, in the description to follow, it is assumed that the radio system is GSM, the first frequency band is 1800-MHz band, and the second frequency band is 900-MHz band, but any other radio system and any other frequency band may be adopted. The operation modes are 1800-MHz mode and 900-MHz mode. Components identical with those described in the first embodiment of the invention are denoted by the same reference numerals in the third embodiment and will not be discussed again.

In FIG. 6, a frequency divider 601 in a frequency dividing section 603 further divides a 1800-MHz in-phase local oscillation signal output by a frequency divider 19 into two parts. A dummy circuit 602 is connected to the quadrature local oscillation signal side of the frequency divider 19. At the 1800-MHz mode operation time, the frequency divider 19 outputs a 1800-MHz in-phase local oscillation signal and a 1800-MHz quadrature local oscillation signal to a quadrature demodulator 6 or a quadrature demodulator 12. At the 900-MHz mode operation time, the frequency divider 601 outputs a 900-MHz in-phase local oscillation signal and a 900-MHz quadrature local oscillation signal to a quadrature modulator 7 or a quadrature modulator 13. A control section 23 is connected to the frequency divider 601 and the dummy circuit 602 and outputs a signal in response to the operation mode of the multimode radio 600.

Figure 7:
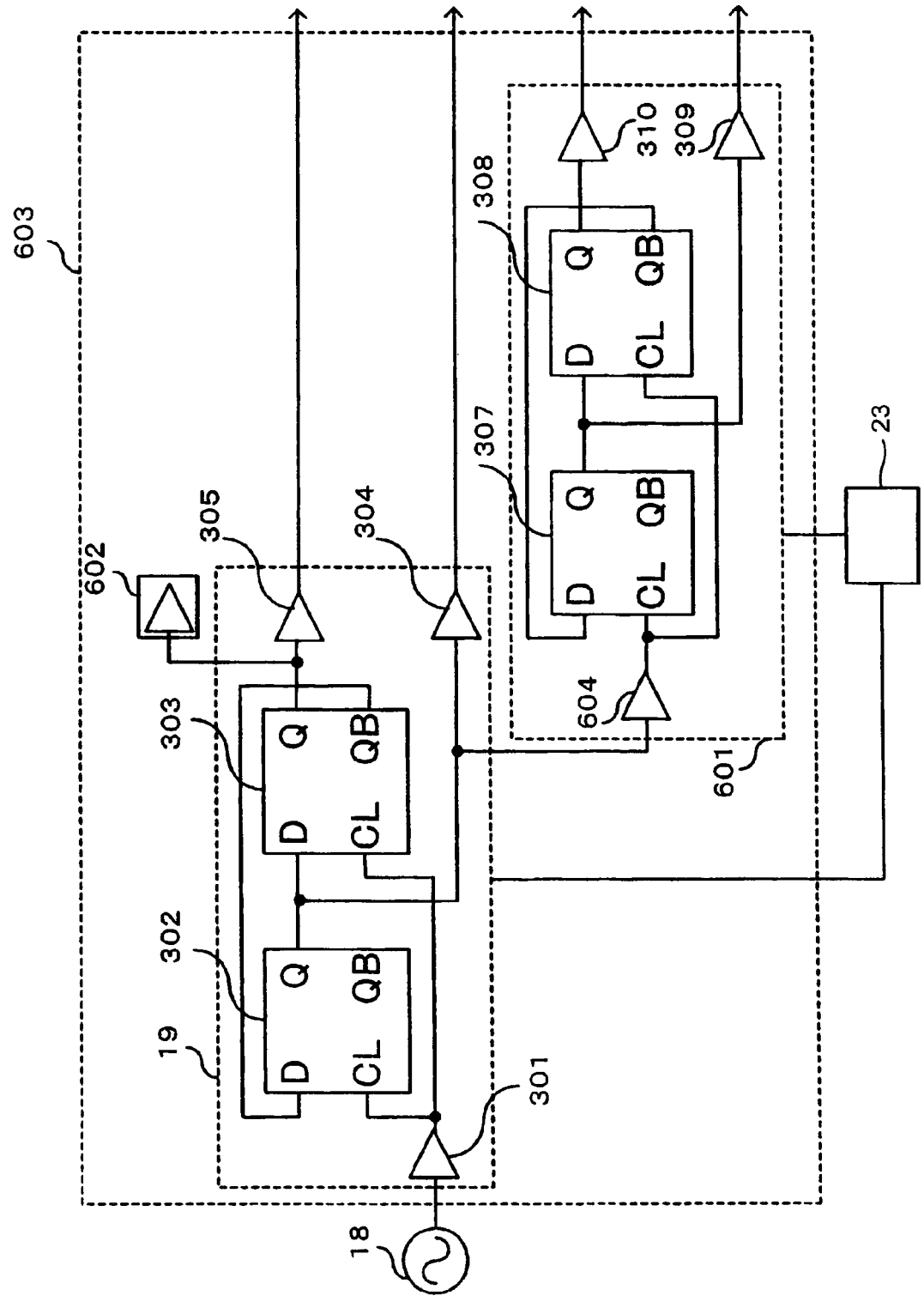
FIG. 7 A diagram to show the configuration of a frequency dividing section of the multimode radio in the third embodiment of the invention.

FIG. 7 shows the configuration of the frequency dividing section 603. The dummy circuit 602 has the same circuit configuration as an input amplifier 604 of the frequency divider 601. At the 1800-MHz mode operation time, the control section 23 turns off a flip-flop 307, a flip-flop 308, an in-phase output amplifier 309, and a quadrature output amplifier 310 of the frequency divider 601. The input amplifier 604 and the dummy circuit 602 are turned on and allow current to flow. At this time, the control section 23 adjusts the current flowing into the input amplifier 604 and the dummy circuit 602. Thus, the phase difference between the 1800-MHz in-phase local oscillation signal and the 1800-MHz quadrature local oscillation signal can be adjusted.

Figure 8:
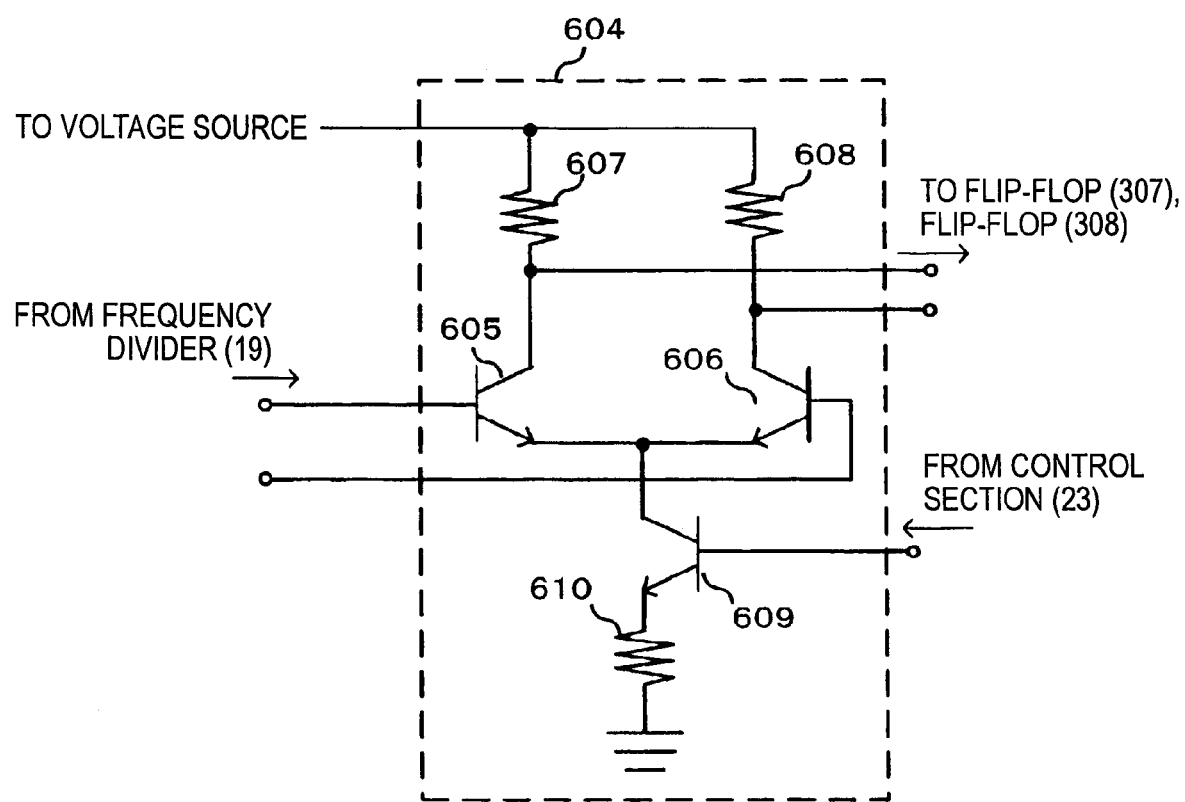
FIG. 8 A diagram to show the circuit configuration of an input amplifier of a frequency divider 601 in the third embodiment of the invention.

FIG. 8 is a circuit diagram to show an example of the input amplifier 604. From FIG. 8, the input amplifier 604 is a differential amplification circuit. Emitter terminals of a transistor 605 and a transistor 606 are connected to form a differential pair. The transistor 605 is connected to a voltage source via a load resistor 607. The transistor 606 is connected to the voltage source via a load resistor 608. The emitters of the transistors 605 and 606 are connected to a transistor 609 operating as a current source. A base of the transistor 609 is connected to the control section 23. The current flowing into the input amplifier 604 can be controlled by a signal voltage from the control section 23 fed into the base of the transistor 609. An emitter of the transistor 609 is grounded through a resistor 610. The dummy circuit 602 also has the same circuit configuration. The control section 23 can control the current flowing into the dummy circuit 602 by a signal. The dummy circuit 602 and the input amplifier 604 differ in that the dummy circuit 602 does not output an amplified signal.

When the multimode radio 600 operates in the 900-MHz mode, the 1800-MHz in-phase local oscillation signal output from the frequency divider 19 is input to the transistor 605 and the transistor 606. The 1800-MHz in-phase local oscillation signal is subjected to voltage conversion through the load resistor 607 and the load resistor 608 and is output from a collector of the transistor 605 and a collector of the transistor 606 to a flip-flop 307 and a flip-flop 308.

When the multimode radio 600 operates in the 1800-MHz mode, the input amplifier 604 and the dummy circuit 602 are subjected to current control by a signal from the control section 23. Thus, the input impedances of the input amplifier 604 and the dummy circuit 602 viewed from the frequency divider 19 change. The control section 23 outputs the signal to the input amplifier 604 and the dummy circuit 602 so that the phase difference between the 1800-MHz in-phase local oscillation signal and the 1800-MHz quadrature local oscillation signal output from the frequency divider 19 becomes 90°. At this time, the current flowing into the input amplifier 604 may be made smaller than the current flowing at the 900-MHz mode operation time for controlling the phase difference, and the power consumption of the multimode radio 600 can be suppressed.

Thus, the frequency dividers are shared among radio systems and are combined, so that a multimode radio whose circuit scale is lessened and simplified can be provided.

In the third embodiment, the input amplifier 604 and the dummy circuit 602 are each a balanced differential amplification circuit, but may be each an unbalanced circuit.

In the third embodiment, the dummy circuit 602 is connected to the quadrature local oscillation signal side of the frequency divider 19 and the frequency divider 601 is connected to the in-phase local oscillation signal side, but the connection may be opposite.

In the third embodiment, the current flowing into the input amplifier 604 and the dummy circuit 602 is controlled by the signal from the control section 23. However, the current flowing into the dummy circuit 602 may be controlled by the signal from the control section 23 as the current flowing into the input amplifier 604 is fixed. The current flowing into the input amplifier 604 may be controlled by the signal from the control section 23 as the current flowing into the dummy circuit 602 is fixed. In this case, the circuit configuration of the dummy circuit 602 may be the same as the circuit configuration of a part of the input amplifier 604 of the frequency divider 601.

Fourth Embodiment

Figure 9:
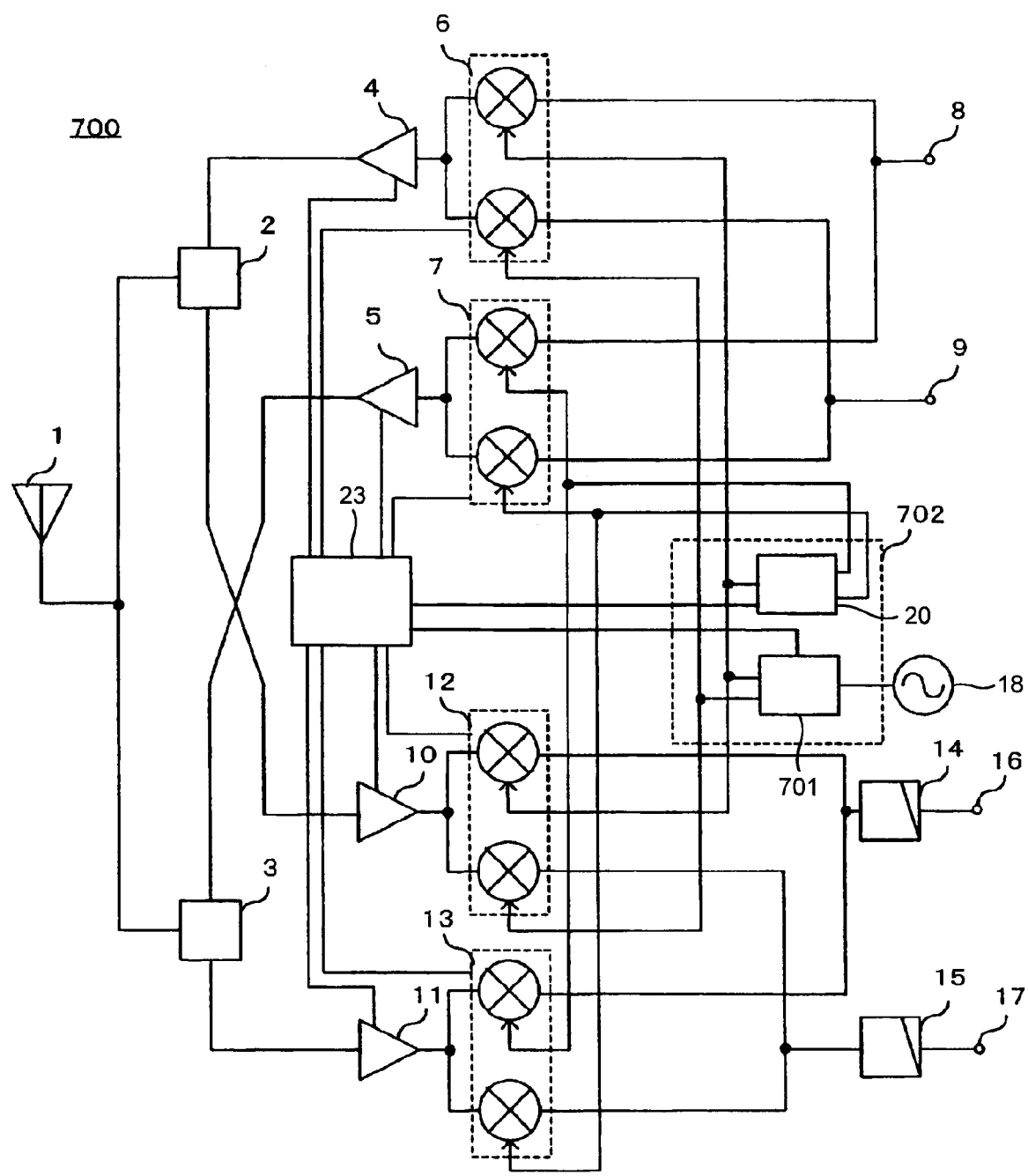
FIG. 9 A diagram to show the configuration of a multimode radio in a fourth embodiment of the invention.

FIG. 9 shows a configuration example of a multimode radio in a fourth embodiment of the invention. A multimode radio 700 of the fourth embodiment uses a first frequency band and a second frequency band. As a specific example, in the description to follow, it is assumed that the radio system is GSM, the first frequency band is 1800-MHz band, and the second frequency band is 900-MHz band. The operation modes are 1800-MHz mode and 900-MHz mode. Components identical with those described in the first embodiment of the invention are denoted by the same reference numerals in the fourth embodiment and will not be discussed again.

In FIG. 9, a frequency divider 701 in a frequency dividing section 702 is a circuit for dividing output of a local oscillator 18 (3.6-GHz band) into two parts. A frequency divider 20 is a circuit for further dividing a 1800-MHz in-phase local oscillation signal output by the frequency divider 701 into two parts. At the 1800-MHz mode operation time, the frequency divider 701 outputs a 1800-MHz in-phase local oscillation signal and a 1800-MHz quadrature local oscillation signal to a quadrature demodulator 6 or a quadrature demodulator 12. At the 900-MHz mode operation time, the frequency divider 20 outputs a 900-MHz in-phase local oscillation signal and a 900-MHz quadrature local oscillation signal to a quadrature modulator 7 or a quadrature modulator 13. A control section 23 is connected to the frequency divider 20 and the frequency divider 701 and outputs a signal in response to the operation mode of the multimode radio 700.

Figure 10:
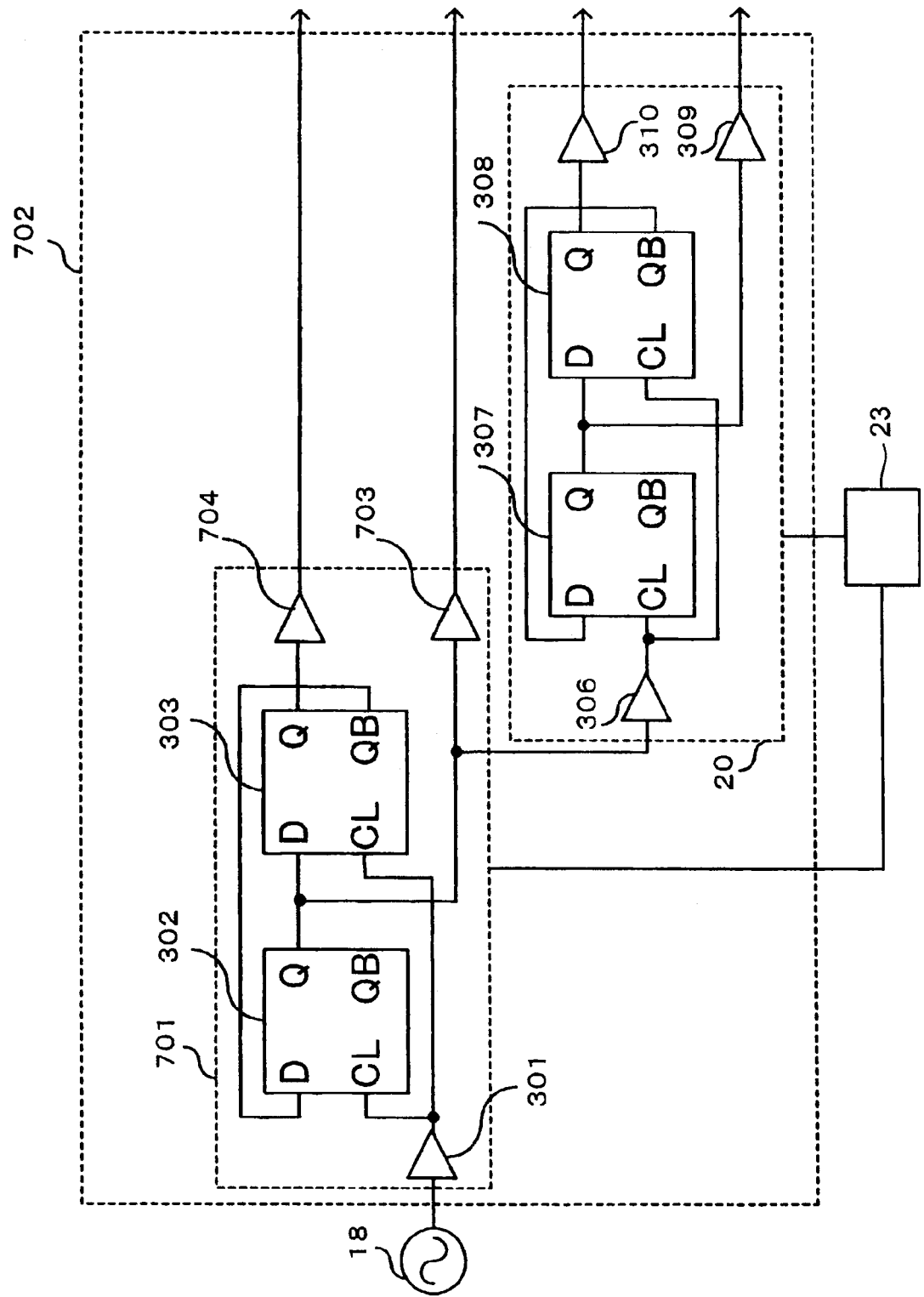
FIG. 10 A diagram to show the configuration of a frequency dividing section of the multimode radio in the fourth embodiment of the invention.

FIG. 10 shows the configuration of the frequency dividing section 702. At the 1800-MHz mode operation time, the control section 23 turns off an input amplifier 306, a flip-flop 307, a flip-flop 308, an in-phase output amplifier 309, and a quadrature output amplifier 310 of the frequency divider 20. At this time, the control section 23 can adjust the phase difference between the 1800-MHz in-phase local oscillation signal and the 1800-MHz quadrature local oscillation signal by adjusting the current flowing into an in-phase output amplifier 703 and a quadrature output amplifier 704.

Figure 11:
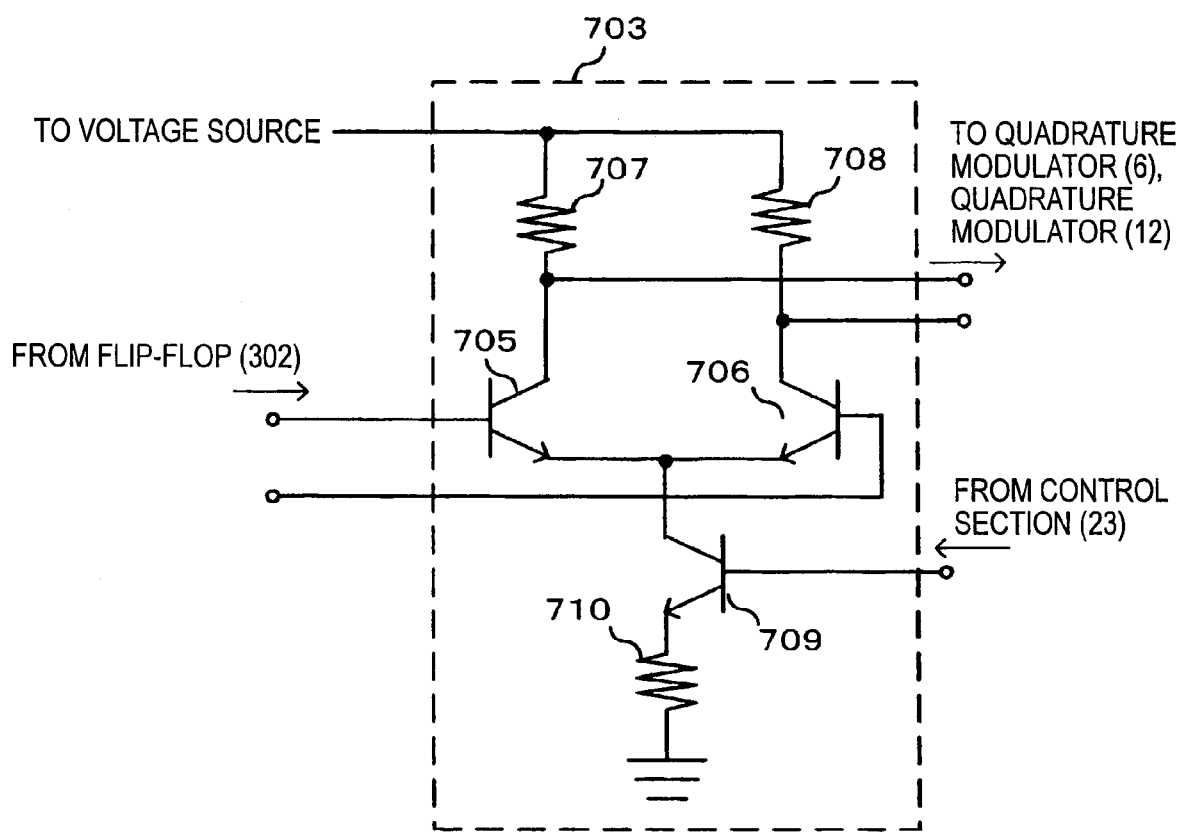
FIG. 11 A diagram to show the circuit configuration of an in-phase output amplifier of a frequency divider 701 in the fourth embodiment of the invention.

FIG. 11 is a circuit diagram to show an example of the in-phase output amplifier 703. From FIG. 11, the in-phase output amplifier 703 is a differential amplification circuit. Emitter terminals of a transistor 705 and a transistor 706 are connected to form a differential pair. The transistor 705 is connected to a voltage source via a load resistor 707. The transistor 706 is connected to the voltage source via a load resistor 708. The emitters of the transistors 705 and 706 are connected to a transistor 709 operating as a current source. A base of the transistor 709 is connected to the control section 23. The current flowing into the in-phase output amplifier 703 can be controlled by a signal voltage from the control section 23 fed into the base of a transistor 709. An emitter of the transistor 709 is grounded through a resistor 710. The quadrature output amplifier 704 also has the same circuit configuration and the current flowing into the quadrature output amplifier 704 can be controlled by a signal from the control section 23.

When the multimode radio 700 operates in the 1800-MHz mode, the in-phase output amplifier 703 and the quadrature output amplifier 704 are subjected to current control by a signal from the control section 23. Thus, the input impedances of the in-phase output amplifier 703 and the quadrature output amplifier 704 change. The control section 23 outputs the signal to the in-phase output amplifier 703 and the quadrature output amplifier 704 so that the phase difference between the 1800-MHz in-phase local oscillation signal and the 1800-MHz quadrature local oscillation signal output from the frequency divider 701 becomes 90°.

Thus, the frequency dividers are shared among radio systems and are combined, so that a multimode radio whose circuit scale is lessened and simplified can be provided.

In the fourth embodiment, the in-phase output amplifier 703 and the quadrature output amplifier 704 are each a balanced differential amplification circuit, but may be each an unbalanced circuit.

In the fourth embodiment, the frequency divider 20 is connected to the in-phase local oscillation signal side, but may be connected to the quadrature local oscillation signal side.

In the fourth embodiment, the current flowing into the in-phase output amplifier 703 and the quadrature output amplifier 704 is controlled by the signal from the control section 23. However, the current flowing into the quadrature output amplifier 704 may be controlled by the signal from the control section 23 as the current flowing into the in-phase output amplifier 703 is fixed. The current flowing into the in-phase output amplifier 703 may be controlled by the signal from the control section 23 as the current flowing into the quadrature output amplifier 704 is fixed.

Fifth Embodiment

Figure 12:
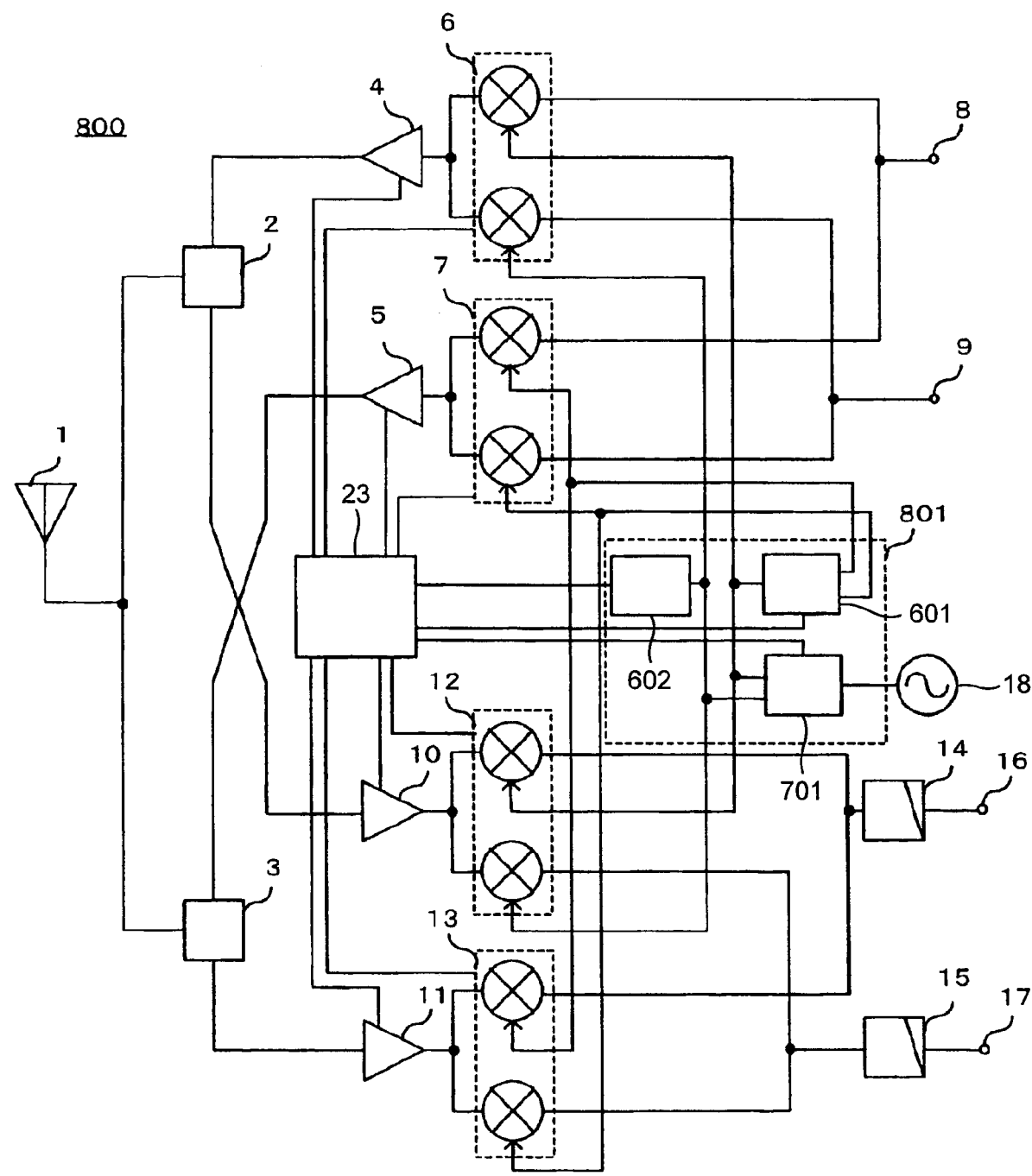
FIG. 12 A diagram to show the configuration of a multimode radio in a fifth embodiment of the invention.

FIG. 12 shows a configuration example of a multimode radio in a fifth embodiment of the invention. A multimode radio 800 of the fifth embodiment uses a first frequency band and a second frequency band. As a specific example, in the description to follow, it is assumed that the radio system is GSM, the first frequency band is 1800-MHz band, and the second frequency band is 900-MHz band, but any other radio system and any other frequency band may be adopted. The operation modes are 1800-MHz mode and 900-MHz mode. Components identical with those described in the first to fourth embodiments of the invention are denoted by the same reference numerals in the fifth embodiment and will not be discussed again.

In FIG. 12, a frequency divider 601 in a frequency dividing section 801 is a circuit for further dividing a 1800-MHz in-phase local oscillation signal output by a frequency divider 701 into two parts. A dummy circuit 602 is connected to the quadrature local oscillation signal side of the frequency divider 701. At the 1800-MHz mode operation time, the frequency divider 701 outputs a 1800-MHz in-phase local oscillation signal and a 1800-MHz quadrature local oscillation signal to a quadrature demodulator 6 or a quadrature demodulator 12. At the 900-MHz mode operation time, the frequency divider 601 outputs a 900-MHz in-phase local oscillation signal and a 900-MHz quadrature local oscillation signal to a quadrature modulator 7 or a quadrature modulator 13. A control section 23 is connected to the frequency divider 701, the frequency divider 601, and the dummy circuit 602 and outputs a signal in response to the operation mode of the multimode radio 800.

Figure 13:
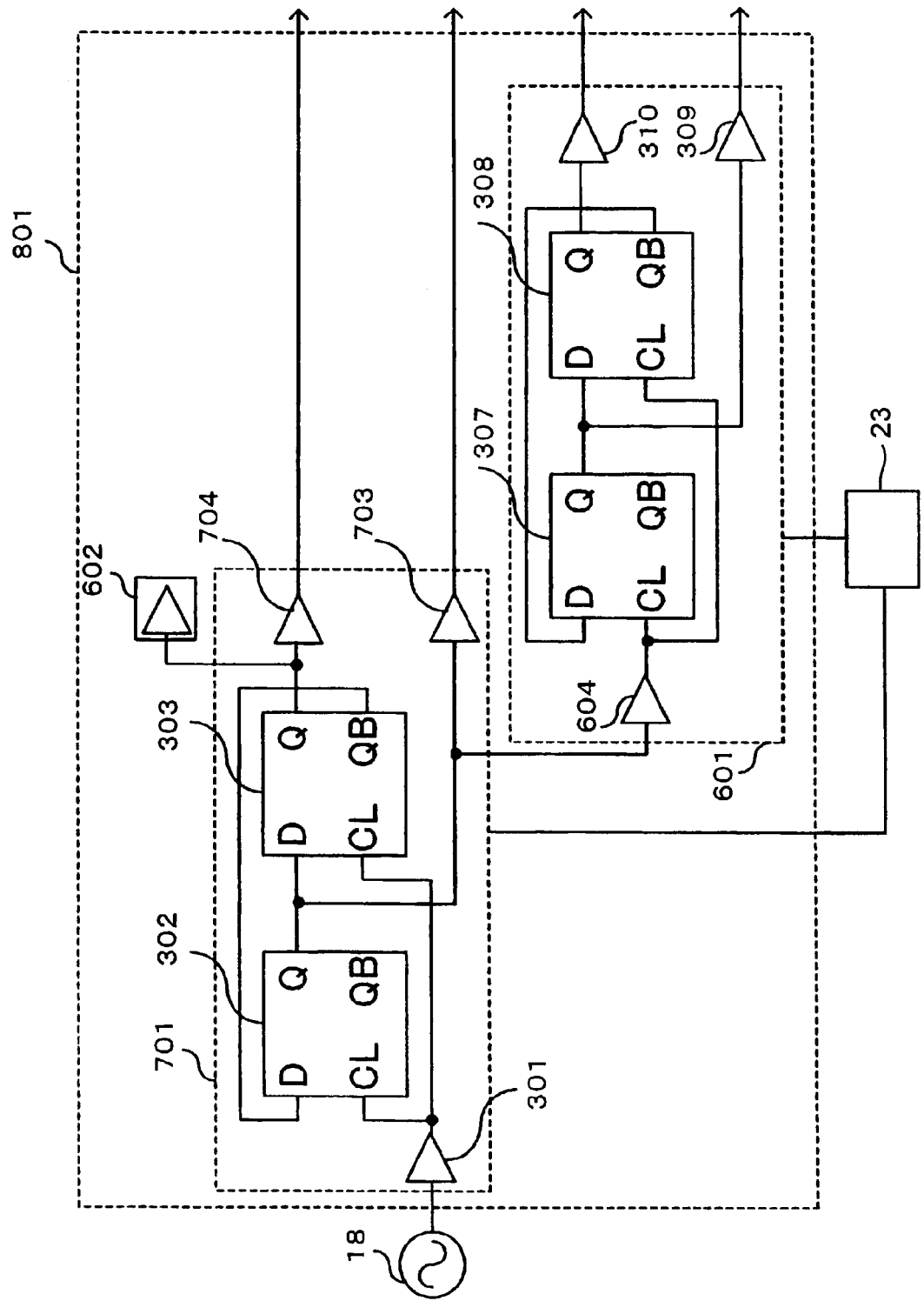
FIG. 13 A diagram to show the configuration of a frequency divider of the multimode radio in the fifth embodiment of the invention.
Figure 14:
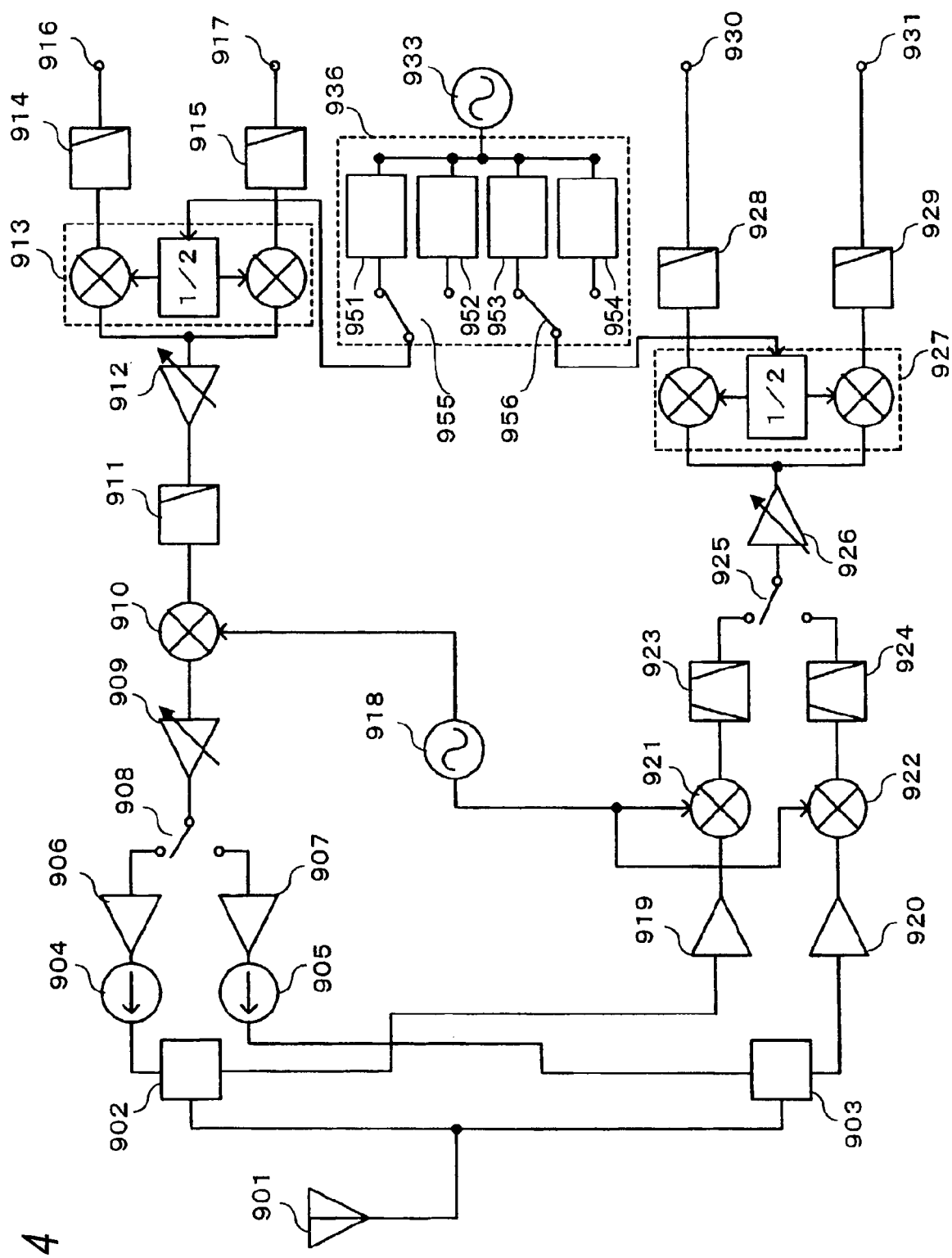
FIG. 14 A diagram to show the configuration of a multimode radio in a related art.

FIG. 13 shows the configuration of the frequency dividing section 801. The dummy circuit 602 has the same circuit configuration as an input amplifier 604 of the frequency divider 601. At the 1800-MHz mode operation time, the control section 23 turns off a flip-flop 307, a flip-flop 308, an in-phase output amplifier 309, and a quadrature output amplifier 310 of the frequency divider 601. The input amplifier 604 is turned on and allows current to flow. The dummy circuit 602 is also turned on by a signal from the control section 23 and allows current to flow. At this time, the control section 23 controls the current flowing into the input amplifier 604, the dummy circuit 602, the in-phase output amplifier 703, and the quadrature output amplifier 704. Thus, the phase difference between the 1800-MHz in-phase local oscillation signal and the 1800-MHz quadrature local oscillation signal can be adjusted.

Thus, the frequency dividers are shared among radio systems and are combined, so that a multimode radio whose circuit scale is lessened and simplified can be provided.

In the description of the fifth embodiment, it is assumed that the circuit is an unbalanced circuit, but the circuit may be a balanced circuit.

In the fifth embodiment, the dummy circuit 602 is connected to the quadrature local oscillation signal side of the frequency divider 701 and the frequency divider 601 is connected to the in-phase local oscillation signal side, but the connection may be opposite.

In the fifth embodiment, the current flowing into the input amplifier 604, the dummy circuit 602, the in-phase output amplifier 703, and the quadrature output amplifier 704 is controlled by the signal from the control section 23. However, the current flowing into any one of the components may be controlled. The current flowing into any two of the components may be controlled. The current flowing into any three of the components may be controlled. To control the current flowing into only either the dummy circuit 602 or the input amplifier 604, the circuit configuration of the dummy circuit 602 may be the same as the circuit configuration of a part of the input amplifier 604 of the frequency divider 601.

While the invention has been described in detail with reference to the specific embodiments, it will be obvious to those skilled in the art that various changes and modifications can be made without departing from the spirit and the scope of the invention.

The present application is based on Japanese Patent Application (No. 2004-60388) filed on Mar. 4, 2004 and Japanese Patent Application (No. 2005-47649) filed on Feb. 23, 2005, which are incorporated herein by reference.

INDUSTRIAL APPLICABILITY

The multimode radio according to the invention has the advantage that the circuit scale is lessened and simplified by sharing and combining frequency dividers compatible with different radio systems, is useful in the communication field, etc., and can be used with electric machines relating to communications, for example, a mobile telephone, a wireless LAN, etc.

The invention claimed is:

1. A frequency dividing circuit comprising:
   a first frequency divider for dividing output of a local oscillator and outputting a first in-phase local oscillation signal and a first quadrature local oscillation signal;
   a second frequency divider being connected to an output side of the first in-phase local oscillation signal output for dividing the first in-phase local oscillation signal and outputting a second in-phase local oscillation signal and a second quadrature local oscillation signal; and
   a dummy circuit being connected to the first quadrature local oscillation signal output and having input impedance equal to that of the second frequency divider.

2. The frequency dividing circuit according to claim 1, wherein the dummy circuit is a circuit including a resistor and a capacitor.

3. The frequency dividing circuit according to claim 1, further comprising a control section which is connected to the second frequency divider and turns on and off the second frequency divider.

4. The frequency dividing circuit according to claim 1, wherein the dummy circuit is the same amplifier as an input amplifier of the second frequency divider.

5. The frequency dividing circuit according to claim 4, further comprising a control section which is connected to input amplifier of the second frequency divider and turns on and off the input amplifier of the second frequency divider.

6. The frequency dividing circuit according to claim 1, wherein the dummy circuit is the same circuit as a part of an input amplifier of the second frequency divider.

7. The frequency dividing circuit according to claim 6, further comprising a control section which is connected to input amplifier of the second frequency divider and turns on and off the input amplifier of the second frequency divider.

8. A frequency dividing circuit comprising:
a first frequency divider for dividing output of a local oscillator and outputting a first in-phase local oscillation signal and a first quadrature local oscillation signal;
a second frequency divider being connected to an output side of the first quadrature local oscillation signal output for dividing the first quadrature local oscillation signal and outputting a second in-phase local oscillation signal and a second quadrature local oscillation signal; and
a dummy circuit being connected to the first in-phase local oscillation signal output and having input impedance equal to that of the second frequency divider which is in a turned-off state.

9. The frequency dividing circuit according to claim 8, wherein the dummy circuit is a circuit including a resistor and a capacitor.

10. The frequency dividing circuit according to claim 8, further comprising a control section which is connected to the second frequency divider and turns on and off the second frequency divider.

11. The frequency dividing circuit according to claim 8, wherein the dummy circuit is the same amplifier as an input amplifier of the second frequency divider.

12. The frequency dividing circuit according to claim 11, further comprising a control section for controlling the current of the input amplifier and the dummy circuit.

13. The frequency dividing circuit according to claim 11, further comprising a control section which is connected to input amplifier of the second frequency divider and turns on and off the input amplifier of the second frequency divider.

14. The frequency dividing circuit according to claim 8, wherein the dummy circuit is the same circuit as a part of an input amplifier of the second frequency divider.

15. The frequency dividing circuit according to claim 14, further comprising a control section which is connected to input amplifier of the second frequency divider and turns on and off the input amplifier of the second frequency divider.

* * * * *

UNITED STATES PATENT AND TRADEMARK OFFICE
CERTIFICATE OF CORRECTION

| | | |
|---|---|---|
| PATENT NO. | : 7,816,953 B2 | Page 1 of 1 |
| APPLICATION NO. | : 10/596820 | |
| DATED | : October 19, 2010 | |
| INVENTOR(S) | : Yoshifumi Hosokawa et al. | |

It is certified that error appears in the above-identified patent and that said Letters Patent is hereby corrected as shown below:

In Column 13, line 42 please delete "802.1b" and insert therefor --802.11b--.

Signed and Sealed this
First Day of March, 2011

David J. Kappos
*Director of the United States Patent and Trademark Office*